(12) United States Patent
Lee et al.

(10) Patent No.: US 9,570,711 B2
(45) Date of Patent: Feb. 14, 2017

(54) ORGANIC LIGHT EMITTING DIODE AND MANUFACTURING METHOD THEREFOR

(71) Applicant: SFC CO., LTD., Cheongju (KR)

(72) Inventors: Oun-Gyu Lee, Cheongju (KR);
Young-hwan Park, Cheongju (KR);
Jong-Tae Je, Cheongju (KR)

(73) Assignee: SFC CO., LTD., Cheongju (KR)

( * ) Notice: Subject to any disclaimer, the term of this patent is extended or adjusted under 35 U.S.C. 154(b) by 0 days.

(21) Appl. No.: 14/912,979

(22) PCT Filed: Aug. 21, 2014

(86) PCT No.: PCT/KR2014/007793
§ 371 (c)(1),
(2) Date: Feb. 19, 2016

(87) PCT Pub. No.: WO2015/030430
PCT Pub. Date: Mar. 5, 2015

(65) Prior Publication Data
US 2016/0211485 A1  Jul. 21, 2016

(30) Foreign Application Priority Data

Aug. 26, 2013  (KR) ........................ 10-2013-0101271

(51) Int. Cl.
*H01L 51/50* (2006.01)
*H01L 51/52* (2006.01)
*H01L 51/56* (2006.01)

(52) U.S. Cl.
CPC ......... *H01L 51/5271* (2013.01); *H01L 51/504* (2013.01); *H01L 51/5008* (2013.01);
(Continued)

(58) Field of Classification Search
CPC . H01L 51/5271; H01L 51/5008; H01L 51/504
See application file for complete search history.

(56) References Cited

U.S. PATENT DOCUMENTS 8,498,038 B2 * 7/2013 Noh .................... G02F 1/15
359/273
2011/0114981 A1 * 5/2011 Higaki ............... H01L 51/5265
257/98

FOREIGN PATENT DOCUMENTS

JP  2010-103090 A  5/2010
KR  10-2011-0101640 A  11/2001
(Continued)

OTHER PUBLICATIONS

International Search Report for PCT/KR2014/007793 mailed Oct. 22, 2014.

*Primary Examiner* — Christine Enad
(74) *Attorney, Agent, or Firm* — STIP Law Group, LLC

(57) ABSTRACT

Disclosed are an organic light emitting diode and a method of manufacturing the same, the organic light emitting diode including: a light-transmitting substrate including a first region and a second region separated from the first region; a first lower electrode formed on the first region of the light-transmitting substrate and a second lower electrode formed on the second region thereof; a first organic thin film layer including a first emission material layer, formed on the first lower electrode of the first region, and a second organic thin film layer including a second emission material layer, formed on the second lower electrode of the second region; and a light-transmitting upper electrode formed on the first organic thin film layer and the second organic thin film layer and configured such that portions corresponding to the first region and the second region are connected to each other.

24 Claims, 6 Drawing Sheets

(52) U.S. Cl.
CPC ...... *H01L 51/5212* (2013.01); *H01L 51/5221* (2013.01); *H01L 51/5231* (2013.01); *H01L 51/5234* (2013.01); *H01L 51/5262* (2013.01); *H01L 51/56* (2013.01); *H01L 51/524* (2013.01); *H01L 2251/301* (2013.01); *H01L 2251/305* (2013.01); *H01L 2251/306* (2013.01); *H01L 2251/308* (2013.01); *H01L 2251/558* (2013.01)

(56) References Cited

FOREIGN PATENT DOCUMENTS

| | | |
|---|---|---|
| KR | 10-2006-0095489 A | 8/2006 |
| KR | 10-2011-0064672 A | 6/2011 |
| KR | 10-2014-0055911 A | 5/2014 |

\* cited by examiner

ORGANIC LIGHT EMITTING DIODE AND MANUFACTURING METHOD THEREFOR

CROSS-REFERENCE TO RELATED APPLICATIONS

This application is the U.S. National Phase under 35 U.S.C. §371 of International Application No. PCT/KR2014/007793 filed on Aug. 12, 2014, which in turn claims the benefit of Korean Application No. 10-2013-0101271, filed on Aug. 26, 2013, the disclosures of which are incorporated by reference into the present application.

TECHNICAL FIELD

The present invention relates to an organic light emitting diode and, more particularly, to an organic light emitting diode, which may increase efficiency of light emitted from an organic emission material layer using reinforcement and interference of light and may exhibit high color quality and high luminance.

BACKGROUND ART

Organic light emitting diodes, which are a self-luminous device, are advantageous because of a wide viewing angle, high contrast, fast response time, high luminance, superior driving voltage, excellent response rate, and polychromatic properties.

Typical organic light emitting diodes are configured to include an organic emission material layer for emitting light, and a first electrode and a second electrode disposed on both sides of the organic emission material layer so as to face each other.

Such organic light emitting diodes are classified into a bottom emission type and a top emission type depending on the direction of light emitted from the organic emission material layer. A bottom emission type organic light emitting diode for emitting light to the substrate is configured such that a reflective electrode is formed on an organic emission material layer, and a transparent electrode is formed under the organic emission material layer. As such, when the organic light emitting diode operates in an active matrix mode, light does not pass through the portion thereof on which a thin film transistor is formed, thus reducing the area where light is transmitted. On the other hand, a top emission type organic light emitting diode is configured such that a transparent electrode is formed on an organic emission material layer and a reflective electrode is formed under the organic emission material layer, thus emitting light to a direction opposite the substrate, and thereby the area where light is transmitted is enlarged, resulting in high luminance.

The bottom emission type organic light emitting diode is configured such that an anode is formed on a substrate, and a hole transport layer, an emission material layer, an electron transport layer, and a cathode are sequentially formed on the anode. As such, the hole transport layer, the emission material layer, and the electron transport layer are organic thin films made of an organic compound.

The cathode comprises a metal layer having properties of a reflective layer, so that light generated from the emission material layer is reflected to the anode layer, thereby increasing luminous efficiency.

The driving principle of the organic light emitting diode thus configured is as follows. When voltage is applied between the anode and the cathode, holes injected from the anode are moved to the emission material layer via the hole transport layer, and electrons injected from the cathode are moved to the emission material layer via the electron transport layer. The carriers such as holes and electrons are re-combined in the emission material layer to form excitons. While these excitons return to a ground state from an excited state, light is produced.

As such, the generated light travels linearly to an anode direction, a cathode direction, and the other directions. The light traveling linearly to the anode is escaped to the air layer through glass, and the light traveling linearly to the cathode is reflected from the metal layer that is the cathode, and then goes again to the anode.

In this regard, Korean Patent Application Publication No. 10-2006-0095489 discloses an organic light emitting diode, which is configured such that an emission material layer is interposed between a first electrode and a second electrode, and a reflective layer for reflecting light emitted from the emission material layer to travel toward the second electrode is formed on the first electrode. Also, Korean Patent Application Publication No. 2001/0101640 discloses a technique for increasing luminous efficiency by determining the film thickness between a light-transmitting electrode and a reflective electrode so as to resonate the desired wavelength using interference caused by multiply reflecting light between the light-transmitting electrode and the reflective electrode.

FIG. 1 illustrates an organic light emitting diode manufactured by a conventional technique. Such a conventional technique is specified below. In order to manufacture an organic light emitting diode, a soda-lime or alkali-free glass substrate 10 is coated with a transparent conductive film 20 (ITO), after which a photoresist (PR) is applied thereon using a spin coater, followed by UV exposure, thereby forming a desired pattern. Thereafter, the device is loaded on a vacuum deposition machine, and a hole injection layer (HIL) 30, a hole transport layer (HTL) 40, an emission material layer (EML) 50, an electron transport layer (ETL) 60 and a cathode (a metal electrode) 70 are deposited.

Then when direct-current power or voltage ranging from ones to tens of V is applied to the transparent electrode and the metal electrode to allow current to flow, the organic light emitting diode emits light, and light irradiated toward the cathode is reflected through a reflective plate, and is then irradiated toward the glass substrate.

As such, the reflected light may exhibit an interference effect with light that travels toward the anode from the emission material layer, but conventional organic EL (electroluminescent) devices have low constructive interference effects due to structural limitation thereof, making it impossible to obtain high color coordinates. To obtain color coordinates corresponding to high color quality of the organic light emitting diode, proper color coordinates may be ensured by using a material having low color coordinates or by adjusting the device thickness, but driving voltage, efficiency and lifetime may deteriorate undesirably.

With the goal of solving the above problems, Korean Patent Application Publication No. 10-2014-0055911 (May 9, 2014), filed by the present inventors, discloses an organic light emitting diode configured such that a functional layer that enables mutual reinforcement and interference of transmitted light is formed on a light-transmitting electrode serving as the cathode, and a reflective layer is formed on the functional layer, thus realizing improved color coordinates and luminous effects using mutual reinforcement and interference of reflected light.

The above disclosure may be specified referring to FIG. 2. As illustrated in FIG. 2, the organic light-emitting display device using mutual reinforcement and interference of reflected light due to the presence of the functional layer comprises: a lower electrode 20 formed on a light-transmitting substrate 10; an organic thin film layer 30~60 formed on the lower electrode 20 and including an emission material layer; a light-transmitting upper electrode 71 formed on the organic thin film layer; a functional layer 80 formed on the upper electrode 71 and enabling mutual reinforcement and interference of transmitted light; and a reflective layer 90 formed on the functional layer.

The operation of the organic light-emitting display device including the functional layer, as shown in FIG. 2, is described below in detail.

Specifically, when voltage is applied between the lower electrode 20, formed on the light-transmitting substrate 10, and the light-transmitting upper electrode 71, formed on the organic thin film layer, holes injected from an anode, i.e. the lower electrode, are transferred to the emission material layer via the hole transport layer, and electrons injected from a cathode, i.e. the upper electrode, are transferred to the emission material layer via the electron transport layer. The carriers, that is, holes and electrons, are recombined in the emission material layer to form excitons. When these excitons return to a ground state from an excited state, light is produced.

As such, the generated light travels linearly in the direction of an anode, the direction of a cathode, and other directions. The light traveling linearly to the anode escapes to the air layer through glass, and the light traveling linearly to the cathode passes through the light-transmitting upper electrode 71 and then through the functional layer 80, which is formed on the upper electrode and enables mutual reinforcement and interference of transmitted light, after which the light is reflected by the reflective layer 90 formed on the functional layer, and goes again toward the substrate via the functional layer and then via the upper electrode, and is thus emitted a predetermined period of time after the light traveling linearly to the anode.

As such, the light reflected by the reflective layer 90 causes constructive or destructive interference with the light that travels linearly to the anode by means of the functional layer and the organic thin film layer, the thickness of which is already adjusted, thereby controlling the spectrum characteristics. By virtue of the interference effect of light, the organic light emitting diode allows the optical spectrum of emitted light to have a sharp peak at a specific wavelength, thereby realizing an organic light emitting diode having high color quality and high efficiency.

However, in the case where the functional layer is formed on the upper electrode, the upper electrode must be formed thin to ensure high light transmittance. Accordingly, such an organic light emitting diode may be problematic in that the resistance of the upper electrode is high when manufactured to have a large area. As the upper electrode becomes distant from the electrode contact in the fabrication of a large-area organic light emitting diode, a large voltage drop may occur. Hence, solutions therefor are required.

DISCLOSURE

Technical Problem

Accordingly, the present invention has been made keeping in mind the above problems encountered in the related art, and the present invention is intended to provide an organic light emitting diode, wherein, in the fabrication of a large-area organic light emitting diode having increased efficiency of emission of light from an organic emission material layer, high color quality and a large area, an upper electrode and a reflective layer are connected to each other through ohmic contact, whereby the resistance of the upper electrode may be decreased and thus the voltage drop thereof is lowered, thereby reducing power consumption.

Technical Solution

The present invention provides an organic light emitting diode, comprising: a light-transmitting substrate including a first region and a second region separated from the first region; a first lower electrode formed on the first region of the light-transmitting substrate and a second lower electrode formed on the second region thereof; a first organic thin film layer including a first emission material layer, formed on the first lower electrode of the first region, and a second organic thin film layer including a second emission material layer, formed on the second lower electrode of the second region; and a light-transmitting upper electrode formed on the first organic thin film layer and the second organic thin film layer and configured such that portions corresponding to the first region and the second region are connected to each other, wherein a functional layer that enables mutual reinforcement and interference of transmitted light is formed on a portion of the upper electrode corresponding to any one of the first region and the second region, and a conductive reflective layer is formed on the functional layer and on the remaining portion of the upper electrode on which the functional layer is not formed, the conductive reflective layer being configured such that portions corresponding to the first region and the second region are connected to each other, whereby the upper electrode and the reflective layer are connected to each other through ohmic contact.

In addition, the present invention provides an organic light emitting diode, comprising: a light-transmitting substrate including a first region, a second region separated from the first region, and a third region separated from the first region and the second region; a first lower electrode formed on the first region of the light-transmitting substrate, a second lower electrode formed on the second region thereof, and a third lower electrode formed on the third region thereof; a first organic thin film layer including a first emission material layer, formed on the first lower electrode of the first region, a second organic thin film layer including a second emission material layer, formed on the second lower electrode of the second region, and a third organic thin film layer including a third emission material layer, formed on the third lower electrode of the third region; and a light-transmitting upper electrode formed on the first organic thin film layer, the second organic thin film layer, and the third organic thin film layer and configured such that portions corresponding to the first region, the second region and the third region are connected to each other, wherein a functional layer that enables mutual reinforcement and interference of transmitted light is formed on a portion of the upper electrode corresponding to any one or two of the first region, the second region and the third region, and a conductive reflective layer is formed on the functional layer and on the remaining portion of the upper electrode on which the functional layer is not formed, the conductive reflective layer being configured such that portions corresponding to the first region, the second region and the third region are connected to each other, whereby the upper electrode and the reflective layer are connected to each other through ohmic contact.

In an embodiment, each of the first emission material layer, the second emission material layer and the third emission material layer may be a red, green or blue emission material layer for emitting light in a wavelength range of 380 to 800 nm.

In an embodiment, the functional layer may be formed only on a portion of the upper electrode corresponding to any one of the first region, the second region and the third region. In this case, the functional layer may be formed only on the upper electrode corresponding to the region where the blue emission material layer is formed.

In an embodiment, the organic light emitting diode may further comprise an auxiliary electrode formed on an edge of the lower electrode.

In an embodiment, each lower electrode may be a conductive transparent electrode and may have a thickness of 1 to 1000 nm.

In an embodiment, the upper electrode may have a transmittance of 10% or more, and may have a resistance ranging from 0.1 mΩ to 500Ω before ohmic contact with the reflective layer.

In an embodiment, the upper electrode may have a thickness of 1 to 1000 nm, and a material for the upper electrode may comprise any one or a combination of two or more selected from among copper, chromium, molybdenum, nickel, aluminum, magnesium, silver, gold, platinum, indium tin oxide (ITO), indium zinc oxide (IZO), zinc oxide (ZnO), $ZnO/Ga_2O_3$, $ZnO/Al_2O_3$, sodium, a sodium-potassium alloy, cesium, magnesium, lithium, a magnesium-silver alloy, aluminum, aluminum oxide, an aluminum-lithium alloy, indium, a rare earth metal, and mixtures thereof with an organic light-emitting medium material.

In an embodiment, the functional layer may have a refractive index of 0.1 to 10 and a thickness of 1 to 1000 nm.

In an embodiment, the functional layer may comprise any one or a combination of two or more selected from among an inorganic material, including metal oxide or metal nitride; and an organic material, including a conductive organic material, a polymer compound, a mixture of a conductive organic material and a polymer compound, a hole injection material, a hole transport material, an electron transport material, a host material, and a dopant material.

In an embodiment, mutual reinforcement and interference of light emitted from the organic light emitting diode may be controlled by adjusting a thickness of the functional layer or the light-transmitting upper electrode.

In an embodiment, the reflective layer may have a reflectance of 20% or more.

In an embodiment, the reflective layer may comprise any one or a combination of two or more selected from among aluminum, magnesium, silver, gold, platinum, chromium, cobalt, tungsten, calcium, lithium, and sodium, and may have a thickness of 1 to 5000 nm.

In an embodiment, the organic thin film layer may comprise at least one selected from among a hole injection layer, a hole transport layer, an electron blocking layer, a layer having both a hole injection function and a hole transport function, an emission material layer, a hole blocking layer, an electron transport layer, and an electron injection layer. In this case, mutual reinforcement and interference of light may be controlled by changing a thickness of at least one selected from among the hole injection layer, the hole transport layer, the electron blocking layer, the layer having both a hole injection function and a hole transport function, the emission material layer, the hole blocking layer, the electron transport layer, and the electron injection layer, which are included in the organic thin film layer.

In an embodiment, the emission material layer may comprise a combination of at least one host and at least one dopant.

In an embodiment, the organic light emitting diode may further comprise a capping layer disposed between the lower electrode and the substrate or on an outer surface of the substrate in order to prevent total reflection of light to thus increase luminous efficiency of an organic emission material.

In an embodiment, the organic light emitting diode may include a blue emission material, a green emission material, or a red emission material, and each emission material may be a fluorescent material or a phosphorescent material.

In addition, the present invention provides a method of manufacturing an organic light emitting diode, comprising: providing a light-transmitting substrate including a first region and a second region separated from the first region, and forming a first lower electrode and a second lower electrode respectively on the first region and the second region of the light-transmitting substrate; forming a first organic thin film layer including a first emission material layer on the first lower electrode of the first region and forming a second organic thin film layer including a second emission material layer on the second lower electrode of the second region; forming, on the first organic thin film layer and the second organic thin film layer, a light-transmitting upper electrode configured such that portions corresponding to the first region and the second region are connected to each other; forming, on a portion of the upper electrode corresponding to any one of the first region and the second region, a functional layer that enables mutual reinforcement and interference of transmitted light; and forming a conductive reflective layer on the functional layer and on the remaining portion of the upper electrode on which the functional layer is not formed, wherein the conductive reflective layer is configured such that portions corresponding to the first region and the second region are connected to each other, whereby the upper electrode and the reflective layer are connected to each other through ohmic contact.

In addition, the present invention provides a method of manufacturing an organic light emitting diode, comprising: providing a light-transmitting substrate including a first region, a second region separated from the first region, and a third region separated from the first region and the second region, and forming a first lower electrode, a second lower electrode and a third lower electrode respectively on the first region, the second region and the third region of the light-transmitting substrate; forming a first organic thin film layer including a first emission material layer on the first lower electrode of the first region, forming a second organic thin film layer including a second emission material layer on the second lower electrode of the second region, and forming a third organic thin film layer including a third emission material layer on the third lower electrode of the third region; forming, on the first organic thin film layer, the second organic thin film layer and the third organic thin film layer, a light-transmitting upper electrode configured such that portions corresponding to the first region, the second region and the third region are connected to each other; forming, on a portion of the upper electrode corresponding to any one or two of the first region, the second region and the third region, a functional layer that enables mutual reinforcement and interference of transmitted light; and forming a conductive reflective layer on the functional layer and on the remaining portion of the upper electrode on which the functional layer is not formed, wherein the conductive reflective layer is configured such that portions corresponding to the first region, the second region and the third region are connected to each other, whereby the upper electrode and the reflective layer are connected to each other through ohmic contact.

In an embodiment, the organic thin film layer may comprise at least one selected from among a hole injection layer, a hole transport layer, an electron blocking layer, a functional layer having both a hole injection function and a hole transport function, an emission material layer, a hole blocking layer, an electron transport layer, and an electron injection layer.

In an embodiment, at least one selected from among the lower electrode, the hole injection layer, the hole transport layer, the electron blocking layer, the functional layer having both a hole injection function and a hole transport function, the emission material layer, the hole blocking layer, the electron transport layer, the electron injection layer, the light-transmitting upper electrode, the functional layer and the reflective layer may be formed using a deposition process or a solution process.

Also, the organic light emitting diode according to the present invention may be used for any one selected from among a flat panel display device, a flexible display device, a solid color or white flat panel illuminator, and a solid color or white flexible illuminator.

Advantageous Effects

According to the present invention, the organic light emitting diode is configured such that a light-transmitting upper electrode is provided on an organic thin film layer that includes an emission material layer, and a functional layer that enables mutual reinforcement and interference of transmitted light and a reflective layer for maximizing the constructive interference effect are further provided thereon, thus exhibiting high color quality, high luminance, a long lifetime, and high efficiency.

In the organic light emitting diode according to the present invention, the functional layer that enables mutual reinforcement and interference of transmitted light is formed only on a region of the substrate including predetermined regions, and a conductive reflective layer is directly formed on the upper electrode on a region on which the functional layer is not formed, whereby the upper electrode and the reflective layer are connected to each other through ohmic contact, thus decreasing the resistance of the light-transmitting upper electrode. Thereby, in the fabrication of the organic light emitting diode having increased efficiency of emission of light from an organic emission material layer, high color quality and a large area, a voltage drop of the upper electrode can be lowered, thus reducing the voltage difference between pixels upon driving at a constant current, resulting in an organic light emitting diode having high color quality, high luminance, and long lifetime, as well as low power consumption.

BEST MODE

Hereinafter, a detailed description will be given of embodiments of the present invention with reference to the appended drawings so that the present invention may be easily carried out by those skilled in the art to which the present invention belongs.

In this specification, it will be understood that if any component "includes" any element, this means that it does not exclude other elements but may further include the other elements, unless otherwise described. Also, if it is described that a component is formed "on" another component, it should be understood that a component is provided on a top or bottom of another component, which does not necessarily mean that it is located at the upper position based on the direction of gravity.

Figure 1:
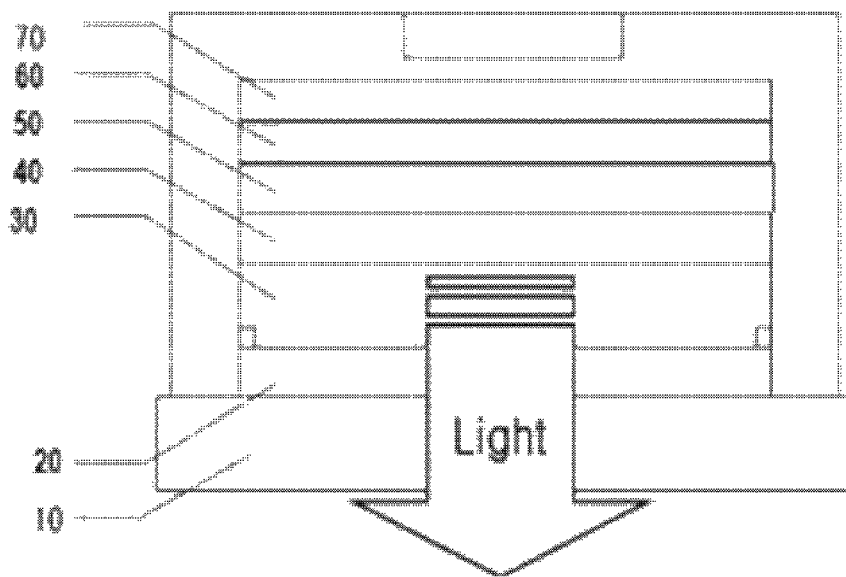
FIG. 1 illustrates the configuration of a conventional organic light emitting diode.
Figure 2:
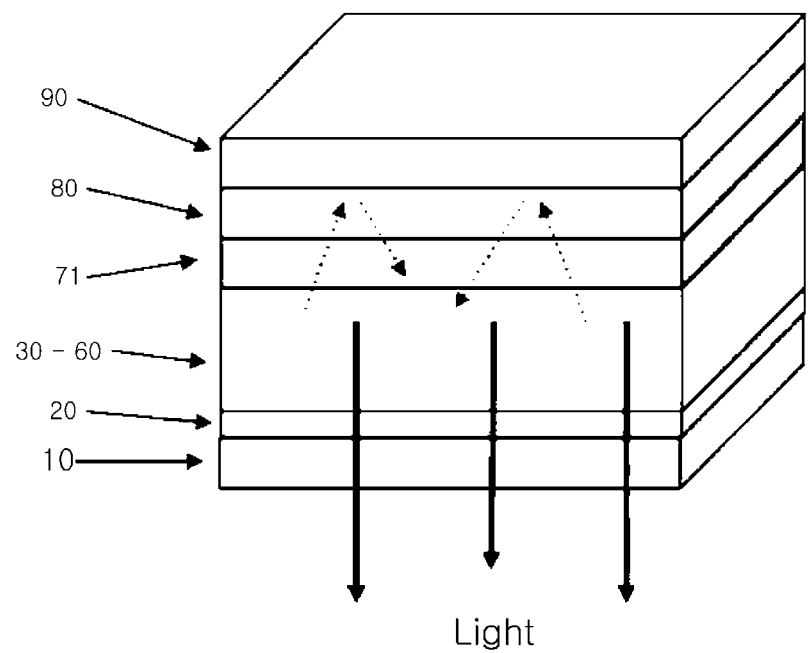
FIG. 2 illustrates the emission of light in an organic light emitting diode configured such that a functional layer is formed on a light-transmitting upper electrode.
Figure 3:
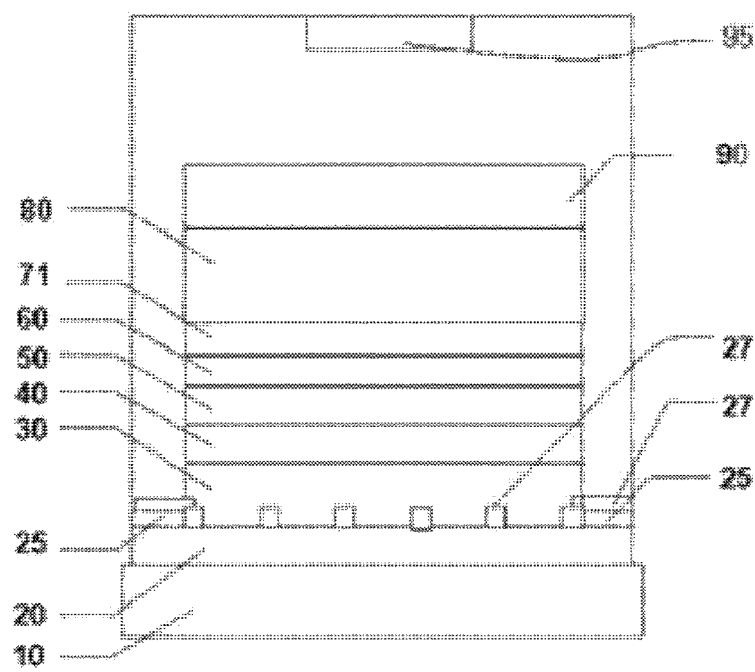
FIG. 3 illustrates the configuration of an organic light emitting diode including a first lower electrode, a first organic thin film layer, a light-transmitting upper electrode, a functional layer and a conductive reflective layer, according to the present invention.

FIG. 3 illustrates the configuration of an organic light emitting diode including a first lower electrode, a first organic thin film layer, a light-transmitting upper electrode, a functional layer and a conductive reflective layer, according to an embodiment of the present invention.

The organic light emitting display device may be manufactured through the following procedures.

1. SixNy is formed to a thickness of 25 nm by sputtering on a soda-lime glass 10 so that Na ions are not diffused into a transparent conductive film.

As a lower electrode 20, a transparent conductive film (ITO) is deposited to a thickness of 50 nm by sputtering thereon, and then an auxiliary electrode 25 composed of Cr and Mo is further deposited.

2. An exposure process is performed to form a pattern for the auxiliary electrode 25. As such, a photoresist (PR) is formed by screen printing, and exposure and etching are performed using an acidic solution as an etchant for Cr and Mo, thus forming the auxiliary electrode 25 at the outer periphery of an emission zone.

3. To form a pattern for an insulating film 27, a material having high electrical insulating properties and viscosity with photosensitivity as in the PR, namely, polyimide, is uniformly applied by spin coating on the upper surface of ITO, after which exposure using an exposure mask, development, and etching are sequentially performed to form a predetermined pattern, thus manufacturing a substrate having an insulating film pattern having a polygonal shape or a curvature.

4. Deposited on the transparent conductive film (ITO) substrate having the insulating film 27 are a hole injection layer (HIL) 30, a hole transport layer (HTL) 40, an emission material layer (EML) 50, an electron transport layer (ETL) 60, an electron injection layer (EIL) and an upper electrode 71 as illustrated in FIG. 3 through the following methods.

Specifically, the ITO glass having the insulating film pattern was placed in a vacuum chamber, a base pressure was set to $1\times10^{-7}$ torr, and DNTPD was deposited on ITO, thus forming a hole injection layer having a thickness of 400 Å or 840 Å, on which a-NPB was then deposited, thus forming a hole transport layer in the thickness range of 250~1200 Å. Subsequently, b-ADN as a host and Compound 400 (3 wt %) as a dopant were co-deposited on the hole transport layer, giving an emission material layer 250 Å thick, after which Alq3 was deposited on the emission material layer, giving an electron transport layer 300 Å thick.

Subsequently, a 5 Å thick LiF electron injection layer was formed, and an upper electrode 71 was then formed by depositing MgAg.

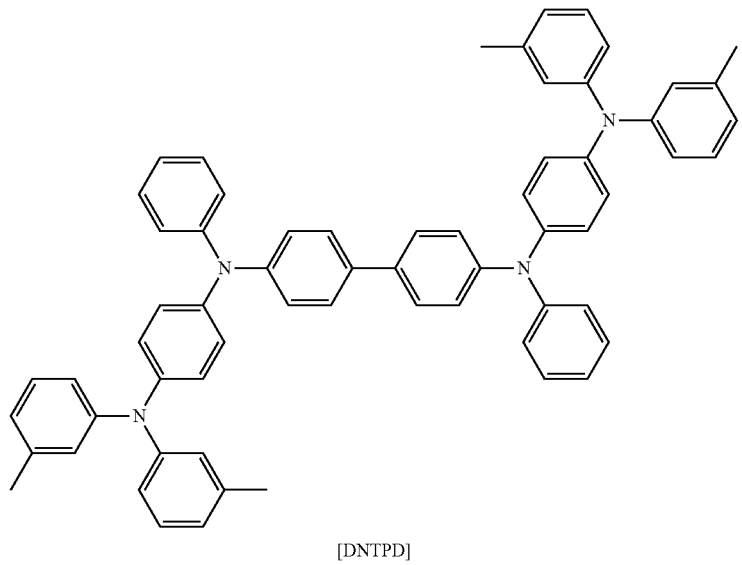

[DNTPD]

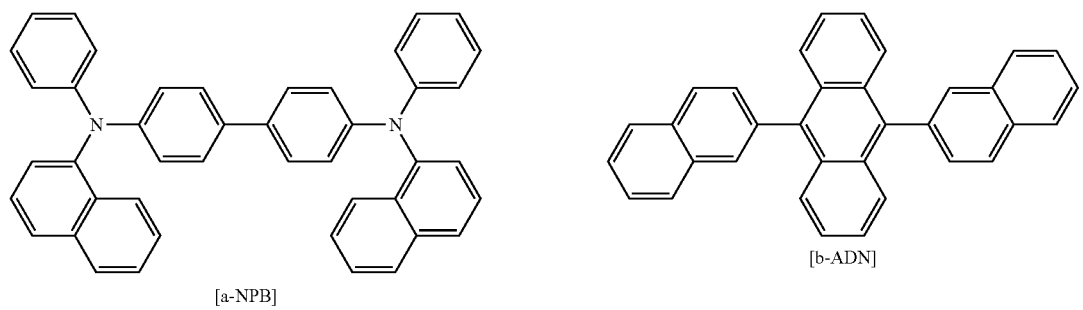

[a-NPB]

[b-ADN]

-continued

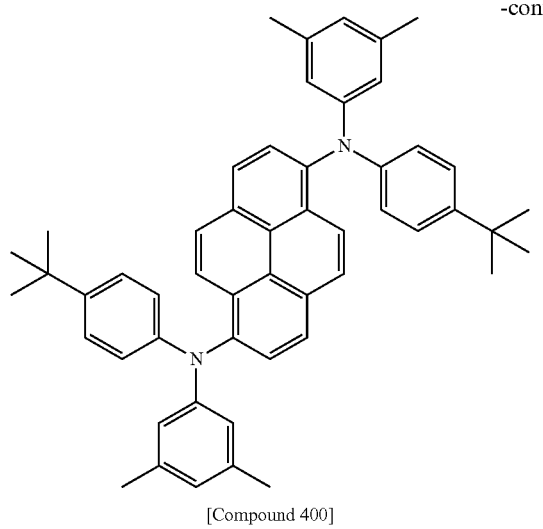

[Compound 400]

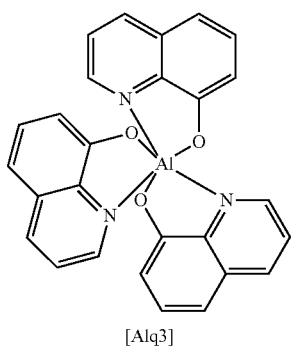

[Alq3]

The upper electrode 71 was composed of Mg and Ag mixed at a ratio of 9:1 and thus possessed light-transmitting properties, and the formed electrode thickness was 145 Å.

5. A functional layer 80 was formed to a thickness of 100~130 nm using N,N'-diphenyl-N,N'-bis-[4-(phenyl-m-tolyl-amino)-phenyl]-biphenyl-4,4'-diamine (DNTPD) by vacuum thermal deposition, and a reflective layer 90 was formed to a thickness of 100 nm using Al by vacuum deposition, resulting in an organic light emitting diode according to the present invention.

Meanwhile, a moisture absorbent 95, as a sealing member for preventing the effect of moisture in air, is provided in the direction opposite the substrate at the top of the organic light emitting diode, thereby absorbing moisture that is contained during the formation of the organic light emitting diode or that penetrates from the outside.

Figure 4:
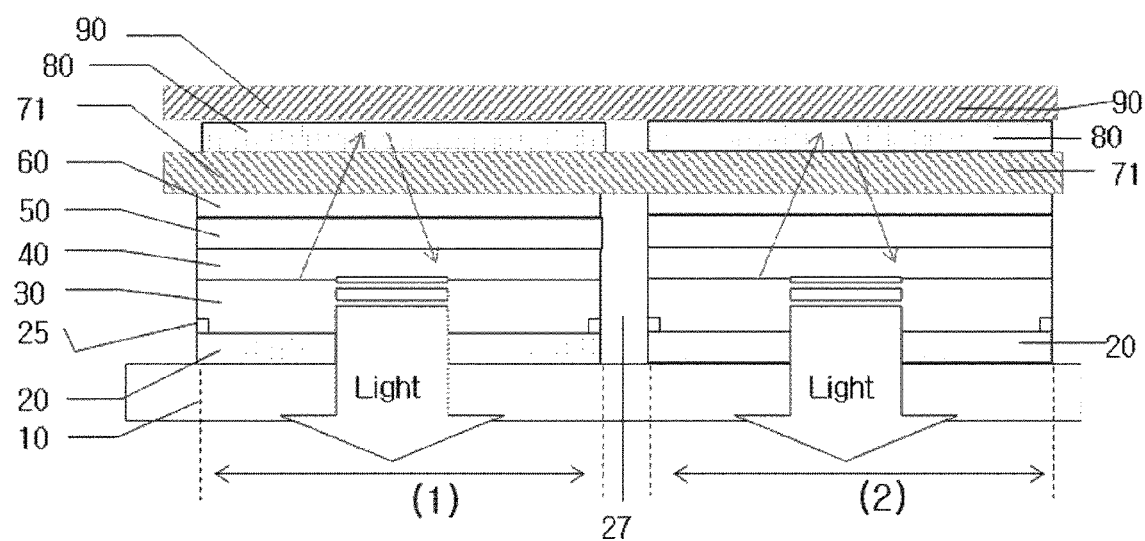
FIG. 4 illustrates the configuration of an organic light emitting diode including, on each region of a light-transmitting substrate having a first region and a second region separated from the first region, a lower electrode, an organic thin film layer, an upper electrode, a functional layer and a reflective layer, according to the present invention.

FIG. 4 illustrates an organic light emitting diode according to the present invention, which is configured such that a lower electrode, an organic thin film layer, an upper electrode, a functional layer and a reflective layer are formed on each region of a light-transmitting substrate including a first region and a second region separated from the first region.

FIG. 4 illustrates the configuration in which the single organic light emitting diode of FIG. 3 is provided on each of the first region (1) (left) and the second region (2) (right) of the substrate.

The present invention addresses an organic light emitting diode, comprising: a light-transmitting substrate 10 including a first region (1) and a second region (2) separated from the first region, a first lower electrode formed on the first region of the substrate, a second lower electrode formed on the second region of the substrate, a first organic thin film layer including a first emission material layer formed on the first lower electrode of the first region, a second organic thin film layer including a second emission material layer formed on the second lower electrode of the second region, and a light-transmitting upper electrode 71 formed on the first organic thin film layer and the second organic thin film layer.

Each of the first emission material layer and the second emission material layer may be selected from among red, green and blue emission material layers, or may be an emission material layer including a phosphorescent material or a fluorescent material. For example, the first organic thin film layer of the first region may include a blue emission material layer, and the second organic thin film layer of the second region may include a red emission material layer, or vice versa. Alternatively, the first region may include a green emission material layer, and the second region may include a red emission material layer, or vice versa. Alternatively, the first region may include a green emission material layer, and the second region may include a blue emission material layer, or vice versa.

As such, the lower electrode 20 on the first region of the substrate 10 and the lower electrode 20 on the second region may be separated from each other by the insulating film 27. The lower electrode may be connected to a wiring unit that is able to drive the organic light emitting diode, and the wiring unit may include switching and driving thin film transistors (not shown), and may provide a signal for emitting light from an organic emission material, thereby driving the organic light emitting diode.

As illustrated in FIG. 4, each organic light emitting diode may have the same operating principle as the organic light emitting diode of FIG. 3, with the exception that the light-transmitting upper electrode 71 and the conductive reflective layer 90 are configured such that the portions corresponding to the first region and the second region are connected to each other.

In this case, the functional layer 80 is formed on the upper electrode of each region. Thus, as the upper electrode, having high electrode resistance, becomes distant from the electrode contact of the upper electrode in the case of driving a large-area display at a constant current, the voltage applied between the two electrodes is increased, undesirably increasing the power consumption.

For example, since the upper electrode may have a large resistance of about 150Ω when deposited to a thickness of 14 nm using MgAg, the resistance thereof has to be decreased.

To solve such problems, in the organic light emitting diode on each of the first region and the second region of the substrate, the functional layer 80 is formed only on a portion of the upper electrode corresponding to any one of the first region and the second region, and the conductive reflective layer 90 is formed on the functional layer and on the remaining portion of the upper electrode on which the functional layer is not formed, whereby the upper electrode and the reflective layer are connected to each other through ohmic contact.

Figure 5:
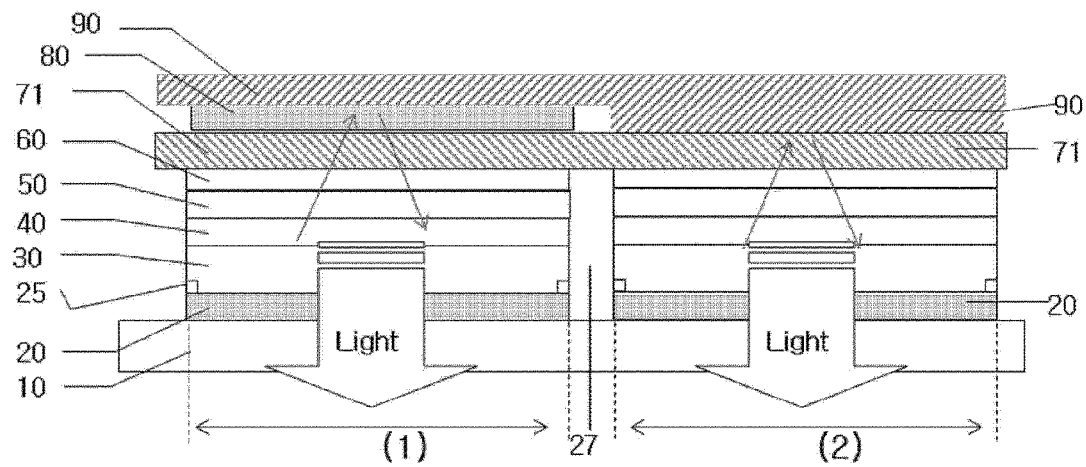
FIG. 5 illustrates the configuration of an organic light emitting diode including, on each region of a light-transmitting substrate having a first region and a second region separated from the first region, a lower electrode, an organic thin film layer, and an upper electrode, in which a functional layer is formed only on a portion of the upper electrode, and a reflective layer is formed on the functional layer and the upper electrode, according to an embodiment of the present invention.

FIG. 5 illustrates an organic light emitting diode according to an embodiment of the present invention, which is configured such that a lower electrode, an organic thin film layer, and an upper electrode are formed on each region of a light-transmitting substrate 10, having a first region and a second region separated from the first region, in which a functional layer 80 is formed only on a portion of the upper electrode corresponding to one of the two regions, and a reflective layer 90 is formed on the functional layer and on the upper electrode.

As illustrated in FIG. 5, the functional layer is formed on the first region, and is not formed on the second region, and the conductive reflective layer is formed on the upper electrode. When the conductive reflective layer is directly connected to the upper electrode through ohmic contact in this way, the resistance of the upper electrode may be lowered. Thereby, the above problems, in which high voltage is applied between the two electrodes, may be solved.

Although light emitted in the direction of the upper electrode from the emission material layer is reflected from the reflective layer via the functional layer with respect to the first region, it is directly reflected from the reflective layer 90 via the light-transmitting upper electrode 71 with respect to the second region.

In the organic light emitting diode configured such that a substrate has first, second and third regions, which are separated from each other, according to another embodiment of the present invention, the organic light emitting diode is independently formed on each of the first, second and third regions, in which a light-transmitting upper electrode 71 is configured such that portions corresponding to the first, second and third regions are connected to each other, and a functional layer 80 is formed on a portion of the light-transmitting upper electrode, and a reflective layer 90 is formed on the functional layer and on the remaining portion of the upper electrode on which the functional layer is not formed.

Figure 6:
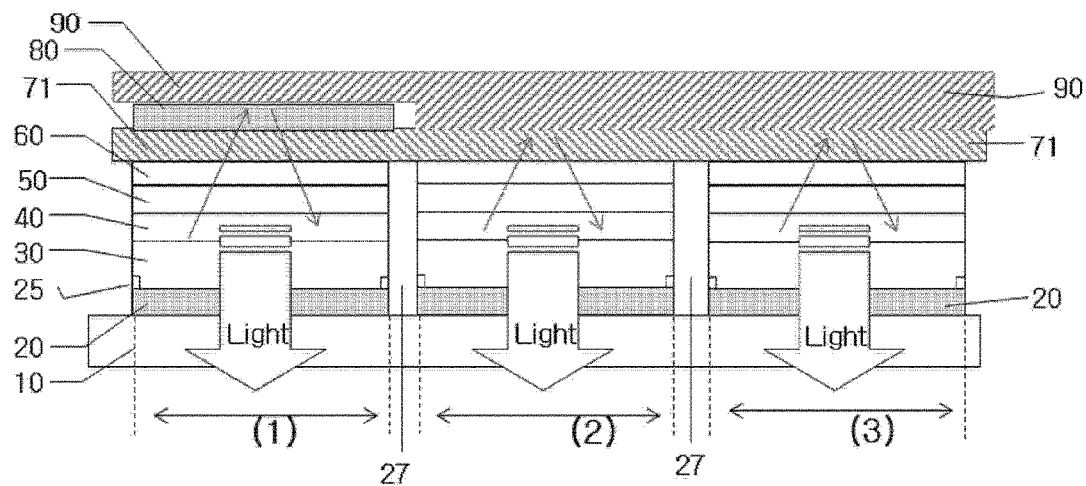
FIG. 6 illustrates the configuration of an organic light emitting diode including, on each region of a light-transmitting substrate having first to third regions, a lower electrode, an organic thin film layer, and an upper electrode, in which a functional layer is formed only on a portion of the upper electrode, and a reflective layer is formed on the functional layer and the upper electrode, according to an embodiment of the present invention.

FIG. 6 illustrates the organic light emitting diode according to an embodiment of the present invention, which is configured such that, on each region of a light-transmitting substrate having first, second and third regions, a lower electrode, an organic thin film layer, and an upper electrode are formed, the functional layer is formed only on a portion of the upper electrode, and the reflective layer is formed on the functional layer and on the upper electrode.

Specifically, FIG. 6 shows the configuration in which the single organic light emitting diode of FIG. 3 is provided on each of the first region (1) (left), the second region (2) (middle), and the third region (3) (right) of the substrate.

The organic light emitting diode comprises: a light-transmitting substrate 10 including a first region (1), a second region (2), and a third region (3), which are separated from each other, a first lower electrode formed on the first region of the substrate, a second lower electrode formed on the second region, a third lower electrode formed on the third region, a first organic thin film layer 30~60 including a first emission material layer formed on the first lower electrode of the first region, a second organic thin film layer 30~60 including a second emission material layer formed on the second lower electrode of the second region, and a third organic thin film layer 30~60 including a third emission material layer formed on the third lower electrode of the third region. Furthermore, a light-transmitting upper electrode 71 is formed on the first to third organic thin film layers.

The light-transmitting upper electrode 71 is configured such that portions corresponding to the first, second and third regions are connected to each other.

Like FIG. 5, the functional layer 80 is formed on a portion of the light-transmitting upper electrode 71, and the reflective layer 90 is formed on the functional layer and on the remaining portion of the upper electrode on which the functional layer is not formed, and the conductive reflective layer is configured such that portions corresponding to the first, second and third regions are connected to each other.

As shown in FIG. 6, the functional layer is formed only on the first region (1), and is not formed on the second and third regions, and the conductive reflective layer 90 is directly formed on the upper electrode 71.

In this case, light emitted in the direction of the upper electrode from the emission material layer is reflected from the reflective layer via the functional layer with respect to the first region, but it is directly reflected from the reflective layer 90 via the light-transmitting upper electrode 71 with respect to the second and third regions.

Also in FIG. 6, each of the first emission material layer, the second emission material layer and the third emission material layer may be selected from among red, green and blue emission material layers, or may be an emission material layer that includes a phosphorescent material or a fluorescent material. For example, the first organic thin film layer of the first region may include a blue emission material layer, and the second organic thin film layer of the third region may include a red emission material layer, or vice versa. Alternatively, the first region may include a green emission material layer, and the second region may include a red emission material layer, or vice versa. Alternatively, the second region may include a green emission material layer, and the third region may include a blue emission material layer, or vice versa.

The substrate 10 is a light-transmitting and electrical insulating substrate made of glass or a polymer, and preferably has to possess superior mechanical strength or dimensional stability.

Such a substrate may be a substrate formed of an inorganic material, for example, a glass substrate, a metal substrate, or a ceramic substrate. Preferable examples of the inorganic material include glass, silicon oxide, aluminum oxide, titanium oxide, yttrium oxide, germanium oxide, zinc oxide, magnesium oxide, calcium oxide, strontium oxide, barium oxide, lead oxide, sodium oxide, zirconium oxide, lithium oxide, boron oxide, silicon nitride, soda-lime glass, barium strontium-containing glass, lead glass, aluminosilicate glass, borosilicate glass, and barium borosilicate glass.

Also, preferable examples of an organic material for the substrate include a polycarbonate resin, an acryl resin, a vinyl chloride resin, a polyethylene terephthalate resin, a polyimide resin, a polyester resin, an epoxy resin, a phenol resin, a silicone resin, a fluorine resin, a polyvinylalcohol resin, a polyvinylpyrrolidone resin, a polyurethane resin, an epoxy resin, a cyanate resin, a melamine resin, a maleic resin, a vinyl acetate resin, a polyacetal resin, and a cellulose resin.

Also, in order to prevent moisture from penetrating into an organic EL display, forming a larger number of inorganic films, applying a fluorine resin, or performing moisture proof treatment or hydrophobic treatment is preferably carried out on the substrate made of the material as above. Furthermore, to prevent the penetration of moisture into an organic light emitting medium, the water content of the substrate and the gas permeation coefficient preferably have to be decreased.

Below is a description of the upper electrode and the lower electrode. The lower electrode 20 is a light-transmitting electrode. Upon bottom emission, the lower electrode becomes an anode corresponding to a hole injection electrode, and the upper electrode becomes a cathode corresponding to an electron injection electrode. However, embodiments of the present invention are not necessarily limited thereto, and the lower electrode 20 may become a cathode and the upper electrode 71 may becomes an anode, depending on the driving method of the organic light emitting diode.

When the lower electrode 20 is an anode, a preferable anode layer may be formed of a metal having high work function (e.g. 4.0 eV or more), an alloy, an electrically conductive compound, or mixtures thereof. Specific examples of the electrode material may include indium tin oxide (ITO), indium zinc oxide (IZO), indium copper (CuIn), tin oxide ($SnO_2$), zinc oxide(ZnO), gold, platinum, and palladium, which may be used alone or in combination of two or more. Such an electrode material may be formed into an anode layer having a uniform thickness by means of a film forming process in a dry state, such as vacuum deposition, sputtering, ion plating, e-beam deposition, CVD (Chemical Vapor Deposition), MOCVD (Metal Oxide Chemical Vapor Deposition), and plasma-enhanced CVD.

Also, the film thickness of the anode layer is not particularly limited, but is preferably 1~1000 nm.

The lower electrode 20 may be provided in the form of a single layer or a plurality of layers using a light-transmitting and conductive material, such as indium tin oxide (ITO), indium zinc oxide (IZO), tin oxide ($SnO_2$), or zinc oxide (ZnO), all of which are transparent and have high conductivity.

Holes and electrons are injected into the emission material layer from the lower electrode 20 and the upper electrode 71, respectively, and then combined together, thus forming excitons. When such excitons return to a ground state from an excited state, light is emitted from the organic emission material layer.

Also, an auxiliary electrode 25 may be formed of a metal component such as Cr, Mo, Al, Ag or alloys thereof on the edge of the lower electrode.

As the auxiliary electrode 25 is provided on the edge of the lower electrode using a metal component having low resistance, it functions to decrease the surface resistance of ITO for the anode to thereby ensure luminance uniformity even when the area of ITO is enlarged.

The auxiliary electrode formed on the lower electrode 20 may be formed by a process such as sputtering, thermal deposition, e-beam thermal deposition, or ion beam sputtering.

Also, an insulating film 27 may be formed on the lower electrode and the auxiliary electrode. The insulating film 27 may be formed of a polymer material or an inorganic material such as inorganic oxide.

Typical examples of the polymer material may include an acryl resin, a polycarbonate resin, a polyimide resin, a fluorinated polyimide resin, a benzoguanamine resin, a melamine resin, cyclic polyolefin, a novolac resin, vinyl cinnamate, cyclized rubber, a polyvinyl chloride resin, polystyrene, a phenol resin, an alkyd resin, an epoxy resin, a polyurethane resin, a polyester resin, a maleic acid resin, and a polyamide resin.

Also, the insulating film is formed of inorganic oxide. Preferable examples of the inorganic oxide include silicon oxide ($SiO_2$ or $SiO_x$), aluminum oxide ($Al_2O_3$, AlON or $AlO_x$), titanium oxide ($TiO_2$), yttrium oxide ($Y_2O_3$ or $YO_x$), germanium oxide ($GeO_2$ or $GeO_x$), zinc oxide (ZnO), magnesium oxide (MgO or $MgO_x$), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), and potassium oxide ($K_2O$). In particular, when heat resistance is required, the material for the insulating film preferably includes an acryl resin, a polyimide resin, fluorinated polyimide, cyclic polyolefin, an epoxy resin, and an inorganic oxide.

Also, such an interlayer insulating film may be processed to a desired pattern by photolithography using a photosensitive group, or may be formed to a desired pattern by a printing process.

The thickness of the insulating film 27 varies depending on the processing conditions or the device requirements, and preferably ranges from 10 nm to 1 nm, more preferably from 100 nm to 100 μm, and much more preferably from 100 nm to 10 μm.

In the present invention, the organic thin film layer 30~60 may be provided on the lower electrode 20.

As used therein, the term "organic thin film layer" refers to a single layer and/or a plurality of layers interposed between the first electrode and the second electrode of the organic light emitting diode. The organic thin film layer includes an emission material layer, and the emission material layer may contain an organic emission material including a host and a dopant.

In the organic thin film layers formed on the first, second and third regions, the kinds of emission material layers formed on the first, second and third regions may be different from or identical to each other.

In the present invention, the organic thin film layer 30~60 including an emission material layer may include at least one of a hole injection layer 30, a hole transport layer 40, a layer having both a hole injection function and a hole transport function (hereinafter referred to as a "H-functional layer"), a buffer layer, an electron blocking layer, an emission material layer 50, a hole blocking layer, an electron transport layer 60, an electron injection layer, and a layer having both an electron transport function and an electron injection function (hereinafter referred to as "E-functional layer").

The thickness of each layer in the organic thin film layer is not particularly limited, but preferably ranges from 5 nm to 5 μm. If the thickness of each layer is less than 5 nm, luminance or durability may deteriorate. In contrast, if the thickness thereof exceeds 5 μm, the applied voltage may be increased. Hence, the thickness of each layer preferably falls in the range of from 10 nm to 3 μm, and more preferably from 20 nm to 1 μm.

In the present invention, at least one selected from among the hole injection layer 30, the hole transport layer 40, the layer having both a hole injection function and a hole transport function, the buffer layer, the electron blocking layer, the emission material layer 50, the hole blocking layer, the electron transport layer 60, the electron injection layer, and the layer having both an electron transport function and an electron injection function may be formed by a single-molecule deposition process or a solution process.

As such, the deposition process is performed in such a manner that a material for each layer is evaporated through heating in a vacuum or under low pressure to form a thin film, and the solution process is performed in such a manner that a material for each layer is mixed with a solvent and then the mixture is subjected to inkjet printing, roll-to-roll coating, screen printing, spray coating, dip coating, or spin coating to form a thin film.

In the present invention, the organic light emitting diode may be used for any one selected from among a flat panel display; a flexible display; a solid color or white flat panel illuminator; and a solid color or white flexible illuminator.

The hole injection layer (HIL) may be formed on the lower electrode using any process such as vacuum deposition, spin coating, casting, or LB technique.

When the hole injection layer is formed by vacuum deposition, the deposition conditions may vary depending on the type of compound for use in the hole injection layer and on the structure and thermal properties of the hole injection layer, and may be selected from among, but are not limited to, for example, a deposition temperature of about 100~500° C., a vacuum level of about $10^{-8}$~$10^{-3}$ torr, and a deposition rate of about 0.01~100 Å/sec.

When the hole injection layer is formed by spin coating, the coating conditions may vary depending on the type of compound for use in the hole injection layer and on the structure and thermal properties of the hole injection layer, and may be selected from among, but are not limited to, for example, a coating rate of about 100~10000 rpm, and a thermal treatment temperature of about 50~300° C. for removal of the solvent after the coating process.

The material for the hole injection layer may include any known hole injection material, and examples of the known hole injection material may include, but are not limited to, N,N'-diphenyl-N,N'-bis-[4-(phenyl-m-tolyl-amino)-phenyl]-biphenyl-4,4'-diamine (DNTPD), a phthalocyanine compound such as copper phthalocyanine, m-MTDATA [4,4',4"-tris(3-methylphenylphenylamino)triphenylamine], NPB (N,N'-di(1-naphthyl)-N,N'-diphenylbenzidine)), TDATA, 2-TNATA (4,4',4"-tris(2-naphthylphenyl-phenylamino)-triphenylamine), Pani/DBSA (polyaniline/dodecylbenzenesulfonic acid), PEDOT/PSS (poly(3,4-ethylenedioxythiophene)/poly(4-styrenesulfonate), Pani/CSA (polyaniline/camphorsulfonic acid), and PANI/PSS (polyaniline/poly(4-styrenesulfonate).

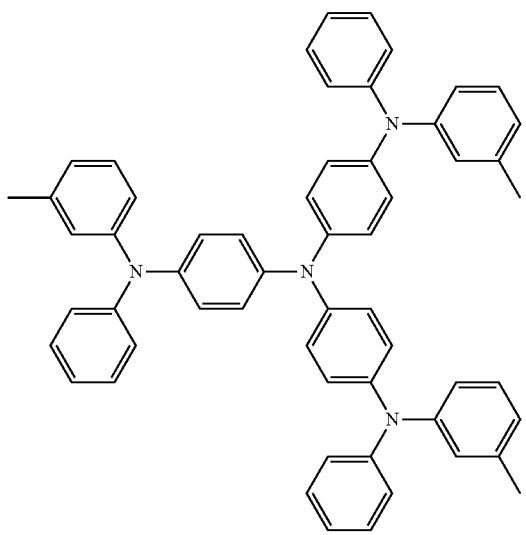

m-MTDATA

[m-MTDSTA]

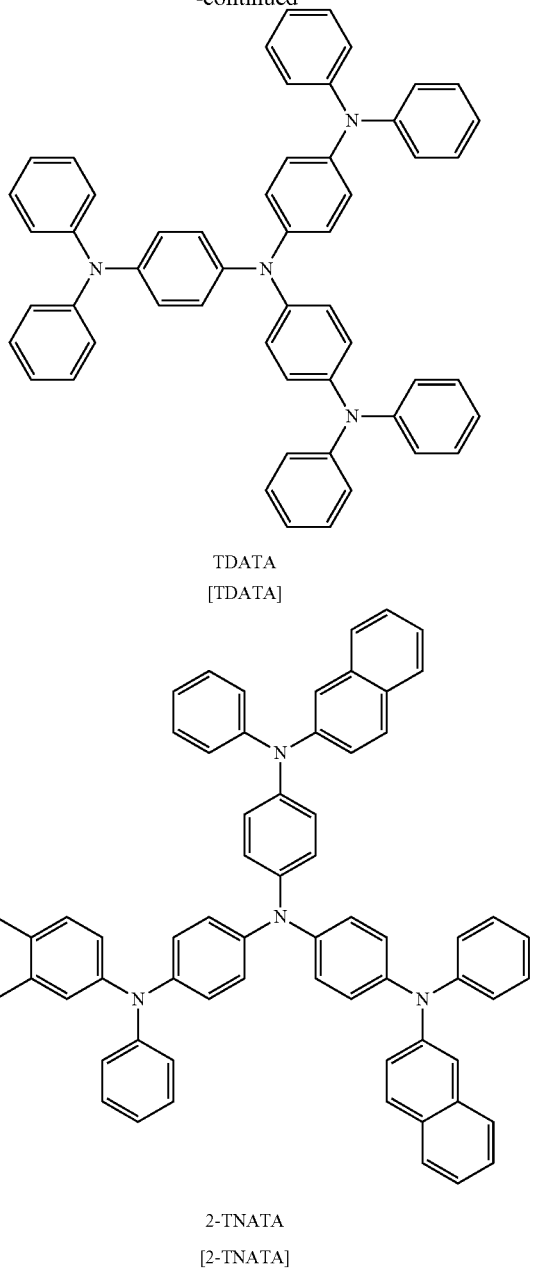

TDATA

[TDATA]

2-TNATA

[2-TNATA]

The thickness of the hole injection layer is about 1~1000 nm, and may be, for example, about 100~1000 Å. Given the above thickness range of the hole injection layer, satisfactory hole injection properties may be obtained without a substantial increase in driving voltage.

Next, the hole transport layer (HTL) may be formed on the hole injection layer using any process such as vacuum deposition, spin coating, casting, or LB technique. When the hole transport layer is formed by vacuum deposition or spin coating, the deposition conditions or the coating conditions may vary depending on the type of compound used, but may be generally selected from among almost the same conditions as in formation of the hole injection layer.

The material for the hole transport layer may include at least one of a styryl compound, a styryl-containing composition, and a known hole transport material. Examples of the known hole transport material may include, but are not limited to, carbazole derivatives such as N-phenylcarbazole and polyvinylcarbazole as represented by Compounds 101 to 104 below, N,N'-bis(3-methylphenyl)-N,N'-diphenyl-[1,1-biphenyl]-4,4'-diamine (TPD), TCTA (4,4',4''-tris(N-carbazolyl)triphenylamine), NPB (N,N'-di(1-naphthyl)-N,N'-diphenylbenzidine)), and diarylamine represented by Compound 105 below.

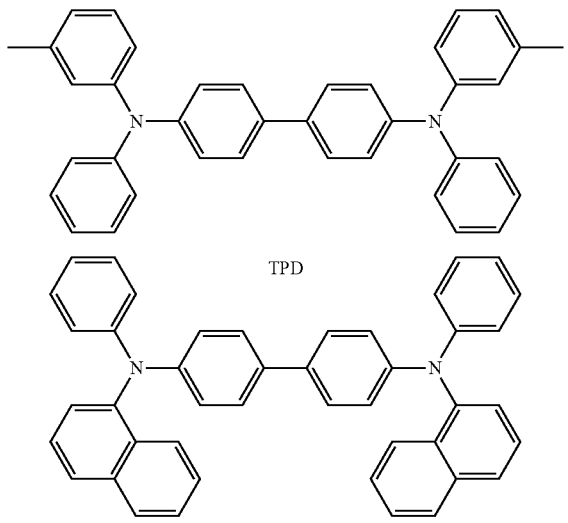

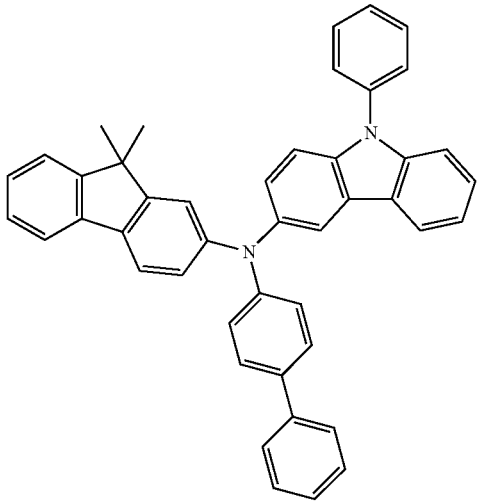

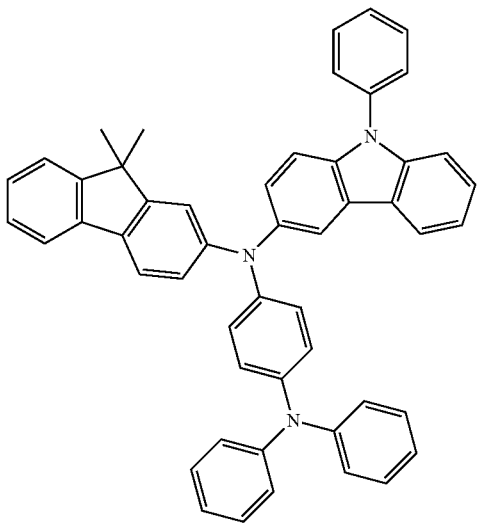

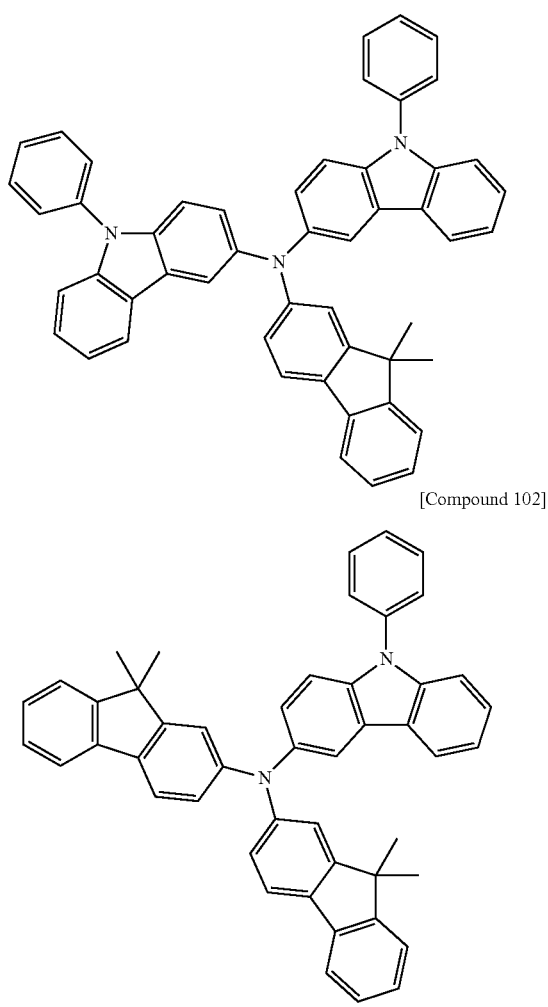

The thickness of the hole transport layer may be about 5~200 nm, for example, about 10~150 nm. Given the above thickness range of the hole transport layer, satisfactory hole transport properties may be obtained without a substantial increase in driving voltage.

The H-functional layer (a functional layer having a hole transport function) may include one or more of materials for the hole injection layer and the hole transport layer, and the thickness of the H-functional layer may be about 5~1000 nm, for example, about 10~100 nm. Given the above thickness range of the H-functional layer, satisfactory hole injection and transport properties may be obtained without a substantial increase in driving voltage.

At least one of the hole injection layer, the hole transport layer and the H-functional layer may be doped with a charge-generating material to enhance film conductivity or may further include a multi-layer, in addition to the known hole injection material, the known hole transport material and/or the material having both a hole injection function and a hole transport function as described above.

The charge-generating material may be exemplified by a p-dopant. The p-dopant may include, but is not limited to, any one of a quinine derivative, a metal oxide, and a cyano group-containing compound. Non-limited examples of the p-dopant may include, but are not limited to, a quinine derivative, such as tetracyano quinone dimethane (TCNQ), and 2,3,5,6-tetrafluoro-tetracyano-1,4-benzoquinone dimethane (F4-CTNQ); a metal oxide such as tungsten oxide and molybdenum oxide; and a cyano group-containing compound such as the following Compound 200.

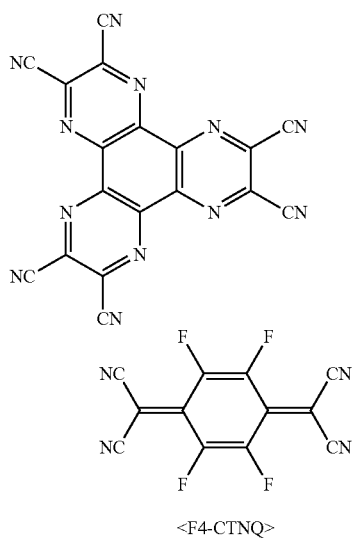

When the hole injection layer, the hole transport layer or the H-functional layer further includes the charge-generating material, the charge-generating material may be variously applied in a manner that is homogeneously dispersed in the hole injection layer, the hole transport layer or the H-functional layer, or is heterogeneously distributed therein.

The buffer layer may be interposed between at least one of the hole injection layer, the hole transport layer and the H-functional layer, and the emission material layer. The buffer layer compensates for an optical resonance distance depending on the wavelength of light emitted from the emission material layer, and functions to confine electrons in the emission material layer to thus increase efficiency. The buffer layer may include the known hole injection material or hole transport material. Alternatively, the buffer layer may include the same material as any one of materials contained in the hole injection layer, the hole transport layer and the H-functional layer, which are formed under the buffer layer.

Subsequently, the emission material layer (EML) may be formed on the hole transport layer, the H-functional layer or the buffer layer, using a process such as vacuum deposition, spin coating, casting, or LB technique.

The kind of emission material layer may vary depending on the region of the substrate, and preferably the emission material layer enables the emission of red, green, or blue light. The organic light emitting diodes may be divided based on the color emitted from the emission material layer, and the organic thin film layer including a single emission material layer and the electrodes at both ends thereof may function as a single sub-pixel in the display device.

When the emission material layer is formed by vacuum deposition or spin coating, the deposition conditions depends on the type of compound used, but may be generally selected from among almost the same conditions as in formation of the hole injection layer.

The emission material layer may include a dopant compound. Specific examples of the dopant may include, but are not limited to, a pyrene-based compound, arylamine, a peryl-based compound, a pyrrole-based compound, a hydrazone-based compound, a carbazole-based compound, a stilbene-based compound, a starburst-based compound, an oxadiazole-based compound, and coumarine.

The emission material layer may further include a host, in addition to the dopant compound.

Examples of the host may include, but are not limited to, Alq3, CBP (4,4'-N,N'-dicarbazole-biphenyl), PVK (poly(n-vinylcarbazole)), 9,10-di(naphthalen-2-yl)anthracene (ADN), TCTA, TPBI (1,3,5-tris(N-phenylbenzimidazol-2-yl)benzene), TBADN (3-tert-butyl-9,10-di(napht-2-yl)anthracene), E3, DSA (distyrylarylene), and dmCBP (the following Formula).

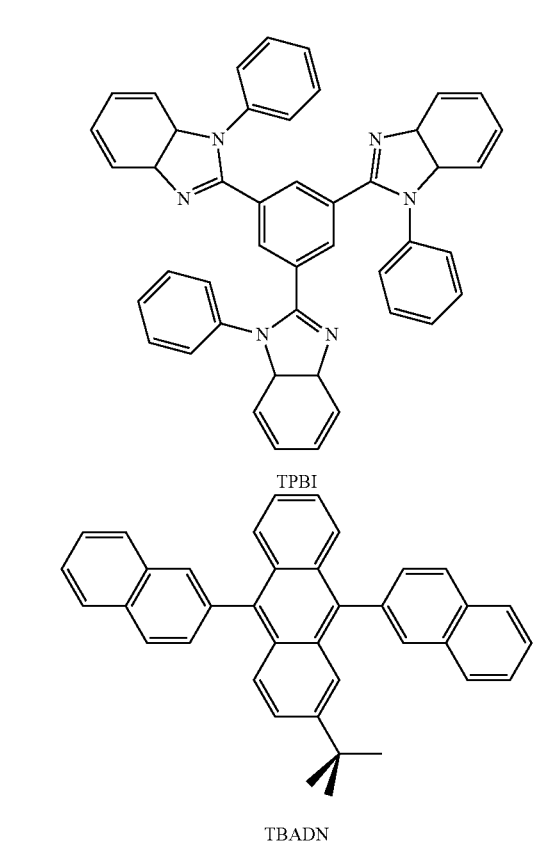

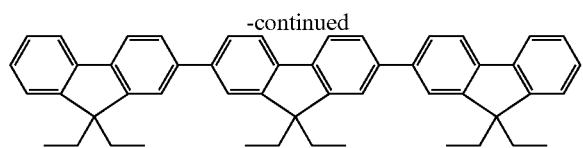

E3

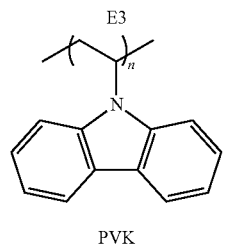

PVK

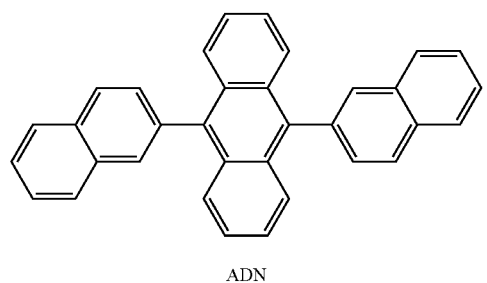

ADN

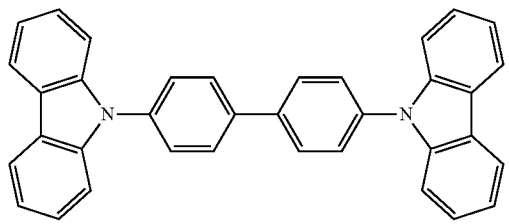

CBP

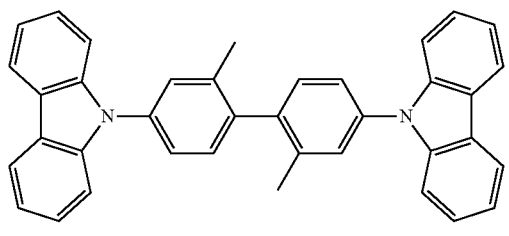

dmCBP

When the emission material layer includes the host and the dopant, the amount of the dopant may be typically set to, but is not limited to, the range of about 0.01~15 parts by weight, based on about 100 parts by weight of the host.

In the present invention, the emission material layer may have a thickness of about 10~100 nm, for example, about 20~60 nm. Given the above thickness range of the emission material layer, superior emission properties may be exhibited without a substantial increase in driving voltage.

Next, the electron transport layer (ETL) is formed on the emission material layer using any process such as vacuum deposition, spin coating, or casting. When the electron transport layer is formed by vacuum deposition or spin coating, the processing conditions thereof may vary depending on the type of compound used, but may be typically selected from among almost the same conditions as in formation of the hole injection layer. The material for the electron transport layer may include any known electron transport material so long as it functions to stably transport electrons injected from the electron injection electrode (cathode). Examples of the known electron transport material may include, but are not limited to, a quinoline derivative, especially tris(8-quinolinolato)aluminum (Alq3), TAZ, Balq, beryllium bis(benzoquinolin-10-olate) (Bebq2), ADN, Compound 201, Compound 202, and oxadiazole derivatives such as PBD, BMD, and BND.

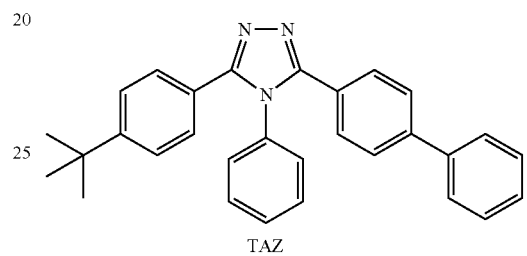

TAZ

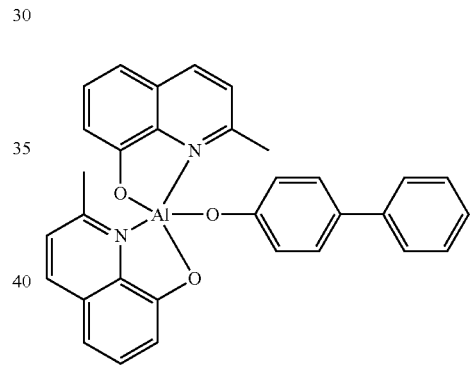

BAlq

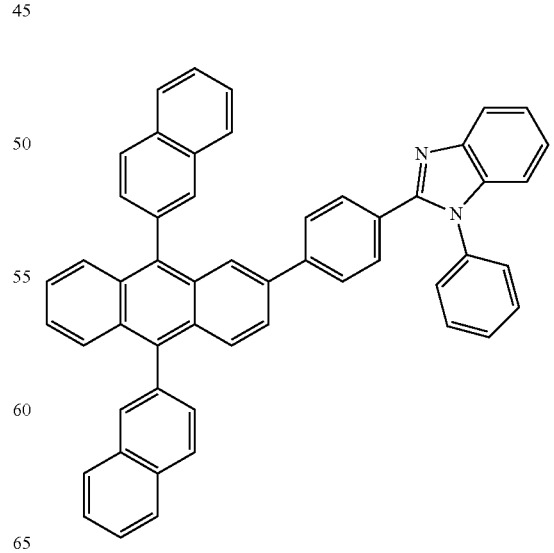

<Compound 201>

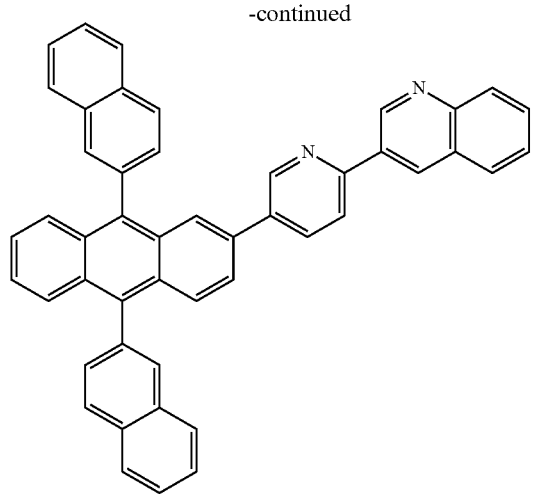

<Compound 202>

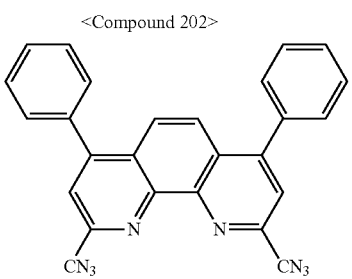

BCP

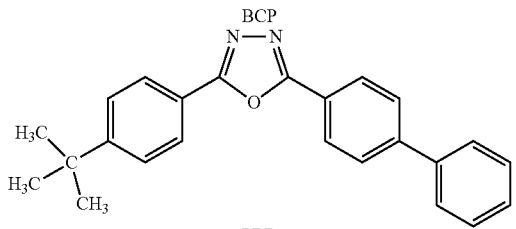

PBD

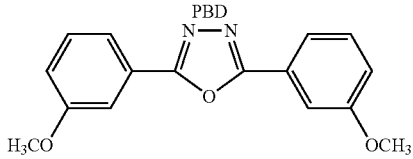

BMD

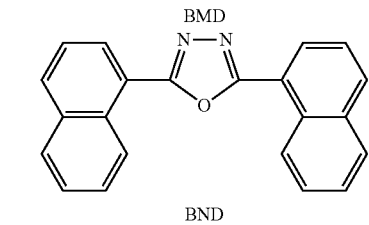

BND

The electron transport layer may have a thickness of about 10~100 nm, for example, about 15~50 nm. Given the above thickness range of the electron transport layer, satisfactory electron transport properties may be obtained without a substantial increase in driving voltage.

Alternatively, the electron transport layer may further include a metal-containing material, in addition to the known electron transportable organic compound.

The metal-containing material may include a Li, Cs, Na, or Ca complex. Non-limited examples of the Li complex may include lithium quinolate (LiQ) and Compound 203 below.

<Compound 203>

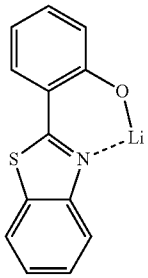

Also, the electron injection layer (EIL) comprising a material that facilitates the injection of electrons from the cathode may be formed on the electron transport layer, and the material thereof is not particularly limited.

The material for the electron injection layer may include any known electron injection material such as CsF, NaF, LiF, NaCl, Li2O, or BaO. The deposition conditions of the electron injection layer may vary depending on the type of compound used, but may be typically selected from among almost the same conditions as in formation of the hole injection layer.

The electron injection layer may have a thickness of about 1~100 Å, for example, about 3~90 Å. Given the above thickness range of the electron injection layer, satisfactory electron injection properties may be obtained without a substantial increase in driving voltage.

Also, when a phosphorescent dopant or a fluorescent dopant is used for the emission material layer, triplet excitons or holes may be prevented from being diffused into the electron transport layer, and holes may be confined in the emission material layer, thus increasing efficiency. The hole blocking layer (HBL) may be formed between the hole transport layer and the emission material layer or between the H-functional layer and the emission material layer using a process such as vacuum deposition, spin coating, casting, or LB technique. When the hole blocking layer is formed by vacuum deposition or spin coating, the formation conditions thereof may vary depending on the type of compound used, but may be typically selected from among almost the same conditions as in formation of the hole injection layer. Any known hole blocking material may be used, and examples thereof may include an oxadiazole derivative, a triazole derivative, or a phenanthroline derivative. For example, the following BCP may be utilized as a material for the hole blocking layer.

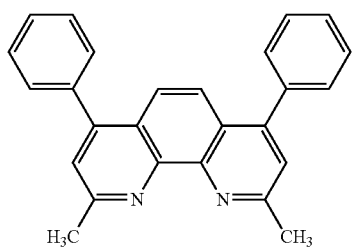

BCP

The hole blocking layer may have a thickness of about 20~1000 Å, for example, about 30~300 Å. Given the above thickness range of the hole blocking layer, superior hole blocking properties may be attained without a substantial increase in driving voltage.

In the present invention, the upper electrode 71 may be composed of a metal having low work function, an alloy, an electrically conductive compound, or inclusions or mixtures thereof.

The upper electrode 71 has to possess high conductivity and light-transmitting properties because it should pass the emitted light through the functional layer.

The upper electrode has a transmittance of at least 10%, preferably at least 20%, more preferably at least 30%, even more preferably at least 40%, still more preferably at least 50%, yet more preferably at least 60%, yet still more preferably at least 70%, much more preferably at least 80%, and most preferably at least 90%.

The upper electrode may have a resistance ranging from 0.1 mΩ to 500Ω, and preferably from 1 mΩ to 100Ω.

Specific examples of the material for the upper electrode may include copper, chromium, molybdenum, nickel, aluminum, magnesium, silver, gold, platinum, indium tin oxide (ITO), indium zinc oxide (IZO), zinc oxide (ZnO), ZnO/Ga2O3, ZnO/Al2O3, sodium, a sodium-potassium alloy, cesium, magnesium, lithium, a magnesium-silver alloy, aluminum oxide, an aluminum-lithium alloy, indium, a rare earth metal, mixtures thereof with a material for an organic light emitting medium, and mixtures thereof with an electron injection material, which may be used alone or in combination of two or more.

Preferable examples of the material for the upper electrode include magnesium (Mg), aluminum (Al), aluminum-lithium (Al—Li), calcium (Ca), magnesium-indium (Mg—In), and magnesium-silver (Mg—Ag).

The film thickness of the upper electrode layer is not particularly limited, but is preferably set to 1~1,000 nm, and more preferably 1~200 nm, and the upper electrode may be formed of any material having a reflective index of 0.1~10.

The upper electrode 71 may be formed using a typical process, but is subjected to vacuum deposition or spin coating in order to minimize deterioration due to thermal damage to the previously deposited organic thin film layer. Specifically, a reduction in lifetime due to thermal damage to the organic thin film layer caused by sputtering at high temperature may be minimized.

In the present invention, when the functional layer is conductive, it is connected to the light-transmitting upper electrode so that conductivity of the upper electrode may become good.

The functional layer is preferably made of a material having high light-transmitting properties to reduce loss of light transmission.

The material for the functional layer preferably has low light absorption properties so as to decrease light loss.

Examples of the material for the functional layer may include, but are not limited to, any one or a combination of two or more selected from among an inorganic material including metal oxide or metal nitride; and an organic material including a conductive organic material, a polymer compound, a mixture of a conductive organic compound and a polymer compound, a hole injection material, a hole transport material, an electron transport material, a host material, and a dopant material.

The metal oxide or metal nitride as the inorganic material may include oxides or nitrides of metal such as In, Sn, Zn, Ti, Zr, Hf, V, Mo, Cu, Ga, Sr, La, or Ru, and specific examples thereof may include conductive or insulating transparent materials, such as ITO, IZO, AZO, SnOx, SiNx, ZnOx, TiN, ZrN, HfN, TiOx, Nb2O5, VOx, MoOx, CuI, InN, GaN, TiO2, CuAlO2, CuGaO2, SrCu2O2, LaB6, and RuOx.

Useful as the organic material, the conductive organic material may include a synthetic polymer having hole transport capability selected from among PEDOT/PSS (poly(3,4-ethylenedioxythiophene)/polystyrene parasulfonate), a starburst-based material, arylamine, perylene, carbazole, hydrazone, stilbene, and pyrrole; or a mixture including a polymer and a low-molecular weight compound having hole transport capability dispersed in the polymer, the polymer comprising at least one selected from among polystyrene, a poly(styrene-butadiene) copolymer, polymethylmethacrylate, polyalphamethylstyrene, a styrene-methylmethacrylate copolymer, polybutadiene, polycarbonate, polyethylterephthalate, polyester sulfonate, polyarylate, fluorinated polyimide, a transparent fluorine resin, and a transparent acryl resin, and the low-molecular weight compound comprising at least one selected from among arylamine, phenylene, carbazole, stilbene, pyrrole, and starburst compounds having derivatives thereof. Also useful is an oxazole-based compound, an isoxazole-based compound, a triazole-based compound, an isothiazole-based compound, an oxadiazole-based compound, a thiadiazole-based compound, a perylene-based compound, or an aluminum complex (e.g. Alq3(tris(8-quinolinolato)-aluminium), BAlq, SAlq, Almq3, and a gallium complex (e.g. Gaq'2OPiv, Gaq'2OAc, 2(Gaq'2)).

Useful as the organic material in the present invention are a hole injection material, including N,N'-diphenyl-N,N'-bis-[4-(phenyl-m-tolyl-amino)-phenyl]-biphenyl-4,4'-diamine (DNTPD), a phthalocyanine compound such as copper phthalocyanine, m-MTDATA[4,4',4"-tris(3-methylphenyl-phenylamino)triphenylamine], NPB(N,N'-di(1-naphthyl)-N,N'-diphenylbenzidine)), TDATA,2-TNATA, Pani/DBSA (polyaniline/dodecylbenzenesulfonic acid), PEDOT/PSS (poly(3,4-ethylenedioxythiophene)/poly(4-styrenesulfonate)), Pani/CSA (polyaniline/camphorsulfonic acid), and PANI/PSS (polyaniline/poly(4-styrenesulfonate)); a hole transport material, including a carbazole derivative such as N-phenylcarbazole or polyvinylcarbazole, N,N'-bis(3-methylphenyl)-N,N'-diphenyl-[1,1-biphenyl]-4,4'-diamine (TPD), TCTA (4,4',4"-tris(N-carbazolyl)triphenylamine), and NPB(N,N'-di(1-naphthyl)-N,N'-diphenylbenzidine); an electron transport material, including a quinolone derivative, especially tris(8-quinolinolato)aluminum (Alq3), TAZ, Balq, beryllium bis(benzoquinolin-10-olate (Bebq2), and ADN; a dopant material, including a pyrene-based compound, arylamine, a peryl-based compound, a pyrrole-based compound, a hydrazone-based compound, a carbazole-based compound, a stilbene-based compound, a starburst-based compound, a noxadiazole-based compound, and coumarine; and a host material, including Alq3, an anthracene-based compound, CBP (4,4'-N,N'-dicarbazole-biphenyl), PVK (poly(n-vinylcarbazole)), TCTA, TPBI(1,3,5-tris(N-phenylbenzimidazol-2-yl)benzene)), E3, DSA(distyrylarylene), and dmCBP.

Typical examples of the polymer compound as the organic material may include an acryl resin, a polycarbonate resin, a polyimide resin, a fluorinated polyimide resin, a benzoguanamine resin, a melamine resin, cyclic polyolefin, a novolac resin, vinyl cinnamate, cyclized rubber, a polyvinyl chloride resin, polystyrene, a phenol resin, an alkyd resin, an epoxy resin, a polyurethane resin, a polyester resin, a maleic acid resin, and a polyamide resin.

Also useful for the functional layer of the invention is a mixture of the conductive organic material and the polymer compound as described above.

The functional layer 80 may be processed to a desired pattern by photolithography using a photosensitive group, and is preferably formed by vacuum deposition or spin coating in order to minimize deterioration due to thermal damage to the previously deposited organic thin film layer.

The thickness of the functional layer 80 may vary depending on the processing conditions or the device requirements, but preferably ranges from 0.5 nm to 1 mm, more preferably from 1 nm to 100 μm, and much more preferably from 10 nm to 10 μm.

The functional layer has to possess light-transmitting properties, and the light transmittance thereof is preferably set to 5~100%.

In the present invention, the reflective layer 90 plays a role in reflecting light passed through the functional layer after having been emitted from the organic thin film layer.

The reflective layer has a reflectance of at least 20%, preferably at least 30%, more preferably at least 40%, even more preferably at least 50%, still more preferably at least 60%, yet more preferably at least 70%, much more preferably at least 80%, and most preferably at least 90%.

The reflective layer may include any one or a combination of two or more selected from among aluminum, magnesium, silver, gold, platinum, chromium, cobalt, tungsten, calcium, lithium, and sodium. Preferably useful is Al or Ag.

The film thickness of the reflective layer is not particularly limited, but is set to the range of 1~5000 nm, and preferably 10~300 nm so as to achieve device slimness.

The upper electrode 90 may be formed by a typical process, but is subjected to vacuum deposition or spin coating in order to minimize deterioration due to thermal damage to the previously deposited organic thin film layer.

Also in the present invention, a capping layer may be provided between the lower electrode layer and the substrate layer, or on the outer surface of the substrate layer, in order to maximize luminous efficiency of each of R, G, and B color coordinates of the emission material. The capping layer may be formed of an organic material or an inorganic material.

The organic material or the inorganic material used for the capping layer may have a refractive index of 1~10, so that the total reflection of light may be blocked when light passes through the interfaces composed of different components to thereby increase luminous efficiency of R, G, and B. The capping layer may be formed to a thickness of 1~120 nm.

In the present invention, the organic light emitting diode includes a blue emission material, a green emission material, or a red emission material, which emits light in the wavelength range of 380~800 nm, and the blue emission material, the green emission material, or the red emission material may be a fluorescent material or a phosphorescent material.

Also, a wiring unit for driving the organic light emitting diode may be provided on the substrate. The wiring unit includes switching and driving thin film transistors (not shown), and gives a signal for emitting light from the organic emission material, thereby driving the organic light emitting diode.

The wiring unit may further include a gate line arranged in one direction of the substrate 10, a data line that intersects the gate line so as to be electrically insulated therefrom, and a common power line.

In addition, the present invention addresses a method of manufacturing an organic light emitting diode, comprising: providing a light-transmitting substrate including a first region and a second region separated from the first region, and forming a first lower electrode and a second lower electrode respectively on the first region and the second region of the light-transmitting substrate; forming a first organic thin film layer including a first emission material layer on the first lower electrode of the first region, and forming a second organic thin film layer including a second emission material layer on the second lower electrode of the second region; forming, on the first organic thin film layer and the second organic thin film layer, a light-transmitting upper electrode configured such that portions corresponding to the first region and the second region are connected to each other; forming, on a portion of the upper electrode corresponding to any one of the first region and the second region, a functional layer that enables mutual reinforcement and interference of transmitted light; and forming a conductive reflective layer on the functional layer and on the remaining portion of the upper electrode on which the functional layer is not formed, wherein the conductive reflective layer is configured such that portions corresponding to the first region and the second region are connected to each other, whereby the upper electrode and the reflective layer are connected to each other through ohmic contact.

In addition, the present invention addresses a method of manufacturing an organic light emitting diode, comprising: providing a light-transmitting substrate including a first region, a second region separated from the first region, and a third region separated from the first region and the second region, and forming a first lower electrode, a second lower electrode and a third lower electrode respectively on the first region, the second region and the third region of the light-transmitting substrate; forming a first organic thin film layer including a first emission material layer on the first lower electrode of the first region, forming a second organic thin film layer including a second emission material layer on the second lower electrode of the second region, and forming a third organic thin film layer including a third emission material layer on the third lower electrode of the third region; forming, on the first to third organic thin film layers, a light-transmitting upper electrode configured such that portions corresponding to the first to third regions are connected to each other; forming, on a portion of the upper electrode corresponding to any one or two of the first to third regions, a functional layer that enables mutual reinforcement and interference of transmitted light; and forming a conductive reflective layer on the functional layer and on the remaining portion of the upper electrode on which the functional layer is not formed, wherein the conductive reflective layer is configured such that portions corresponding to the first to third regions are connected to each other, whereby the upper electrode and the reflective layer are connected to each other through ohmic contact.

As such, the functional layer may be formed by a deposition process or a solution process.

The deposition process means that a material for the functional layer is evaporated by a heating source to form a functional layer on the substrate, and the solution process means that a material for the functional layer is dissolved in a solvent and then undergoes spin coating or printing on the substrate to form a functional layer.

In the present invention, the organic thin film layer may include at least one selected from among a hole injection layer, a hole transport layer, an electron blocking layer, a functional layer having both a hole injection function and a hole transport function, an emission material layer, a hole blocking layer, an electron transport layer, and an electron injection layer.

In this case, at least one of the lower electrode, the organic thin film layer, the light-transmitting upper electrode, the functional layer and the reflective layer may be formed using a deposition process or a solution process.

In an embodiment, an organic light-emitting display device including the organic light emitting diode according to the present invention may comprise a switching thin film transistor, a driving thin film transistor, a capacitor, or an additional organic light emitting diode, which is formed for each pixel.

The method of manufacturing the organic light emitting diode according to the present invention is described through the following example, which is not to be construed as limiting the present invention.

EXAMPLE

Example

Fabrication of Organic Light Emitting Diode

1. $Si_xN_y$ is formed to a thickness of 25 nm by sputtering on a soda-lime glass 10 having first to third regions separated from each other so that Na ions are not diffused into a transparent conductive film.

As a lower electrode 20, a transparent conductive film (ITO) is deposited to a thickness of 50 nm by sputtering thereon, and then an auxiliary electrode 25 composed of Cr and Mo is further deposited, so that a first lower electrode, a second lower electrode, and a third lower electrode are respectively formed on the first region, the second region, and the third region.

2. An exposure process is performed to form a pattern for the auxiliary electrode 25. As such, a photoresist (PR) is formed by screen printing, and exposure and etching are performed using an acidic solution as an etchant for Cr and Mo, thus forming the auxiliary electrode 25 at the outer periphery of an emission zone.

3. To form a pattern for an insulating film 27, a material having high electrical insulating properties and viscosity with photosensitivity as in the photoresist, i.e. polyimide, is uniformly applied by spin coating on the upper surface of ITO, after which exposure using an exposure mask, development, and etching are sequentially performed to form a predetermined pattern, thus manufacturing a substrate having an insulating film pattern having a polygonal shape or a curvature. The insulating film is formed not only on the ITO, as the lower electrode, but also in spaces between the first region and the second region and between the second region and the third region, whereby individual lower electrodes are separated from each other.

4. A hole injection layer (HIL) 30, a hole transport layer (HTL) 40, an emission material layer (EML) 50, an electron transport layer (ETL) 60, an electron injection layer (EIL) and an upper electrode 71 are deposited on the first to third regions of the transparent conductive film (ITO) substrate, which is the upper electrode having the insulating film 27, through the following methods.

Figure 7:
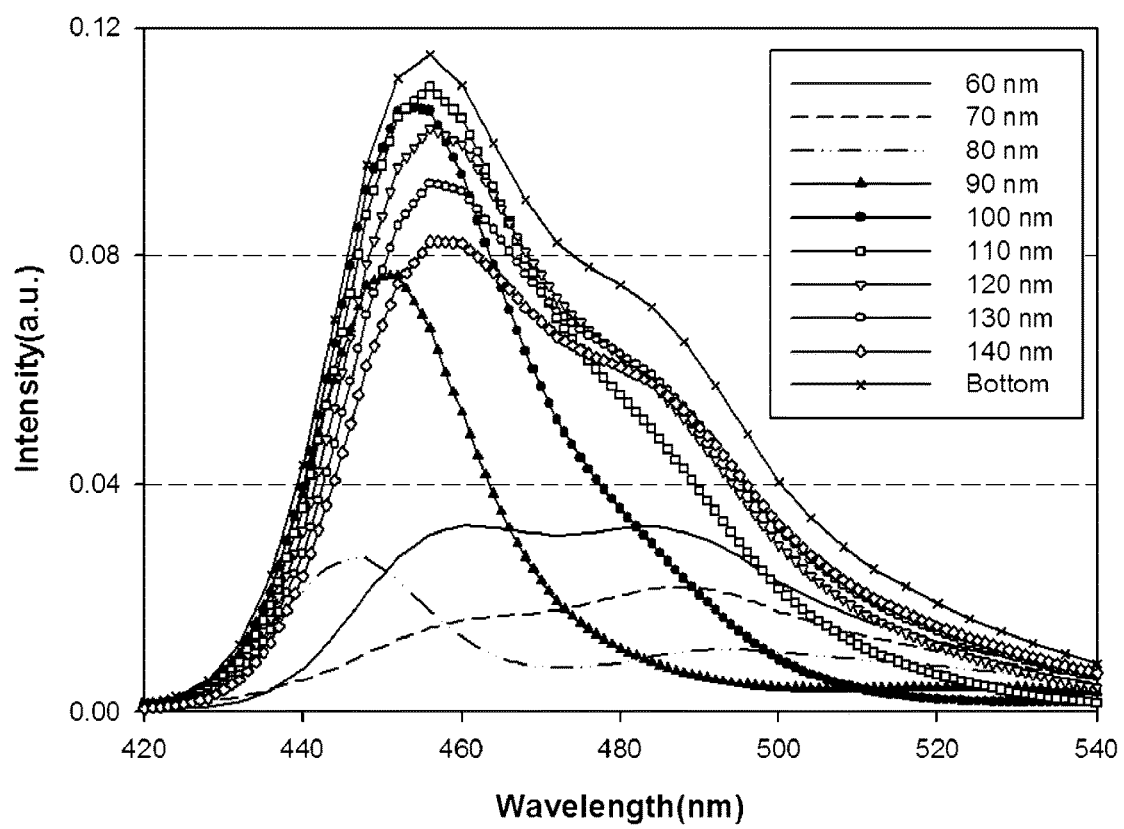
FIG. 7 illustrates the spectrum of the blue layer when the thickness of a hole transport layer (HTL) is changed under the condition that the functional layer is 110 nm thick in the organic light emitting diode according to the present invention.
Figure 8:
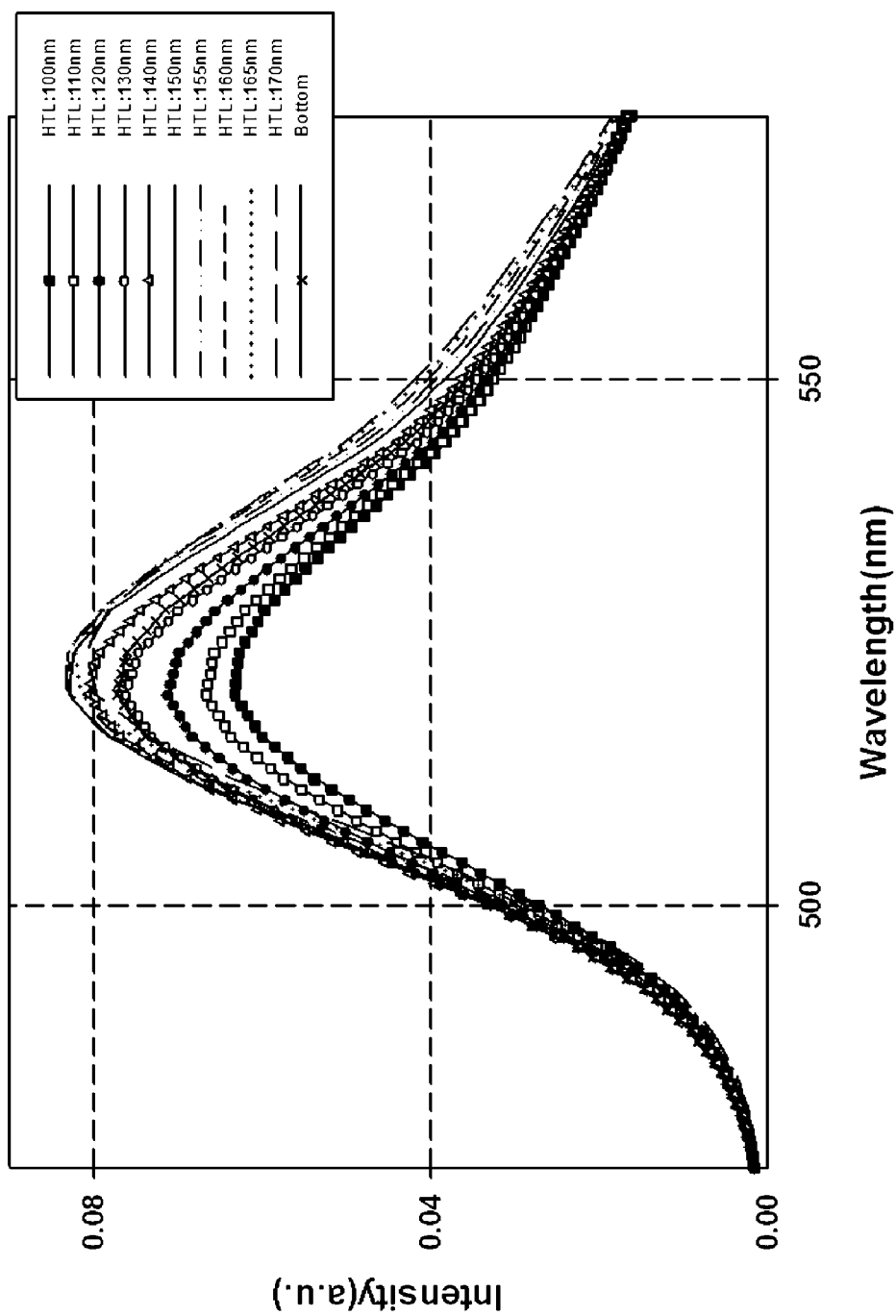
FIG. 8 illustrates the spectrum of the green layer when the thickness of a hole transport layer (HTL) is changed in the absence of the functional layer in the organic light emitting diode according to the present invention.
Figure 9:
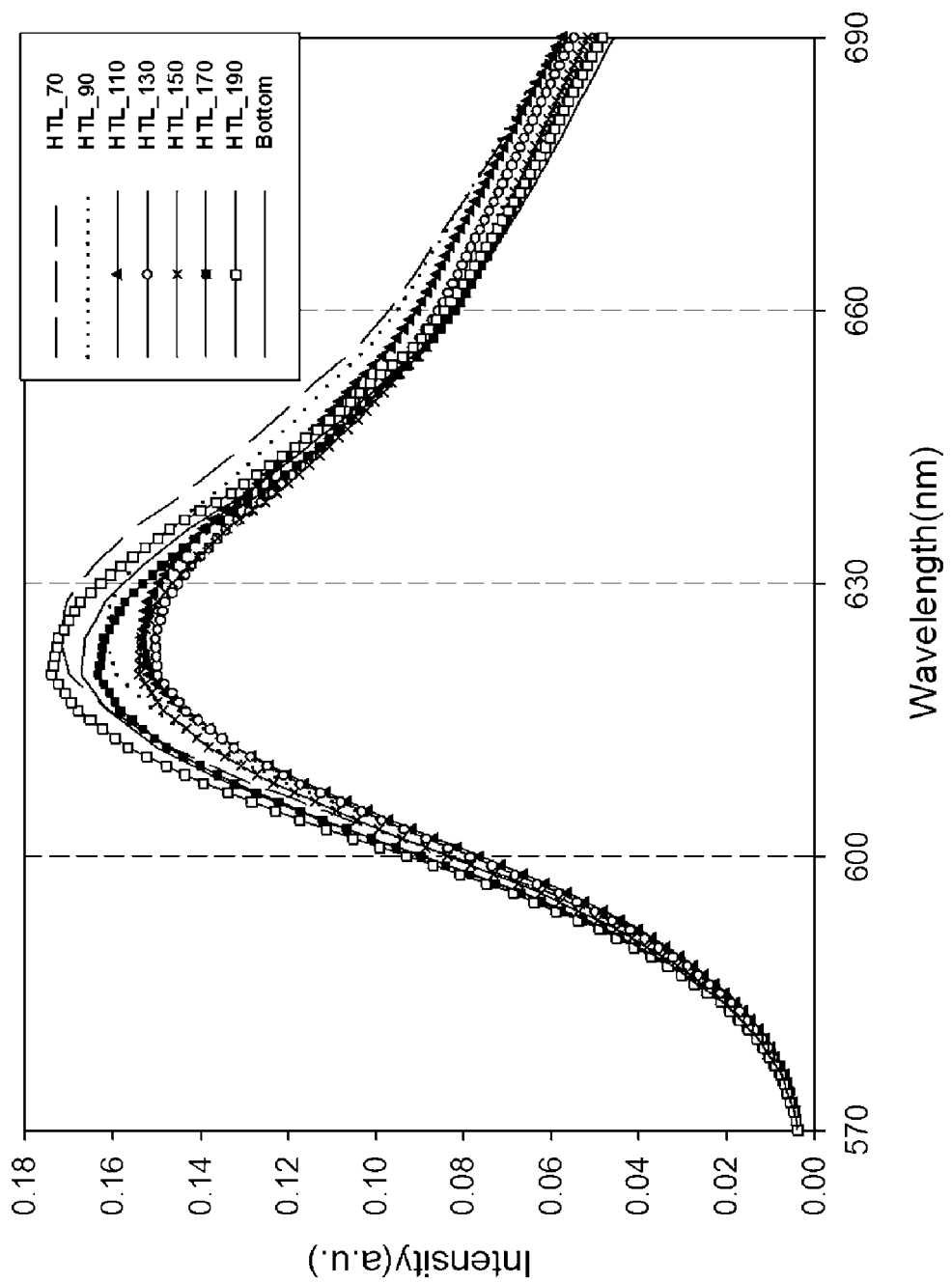
FIG. 9 illustrates the spectrum of the red layer when the thickness of a hole transport layer (HTL) is changed in the absence of the functional layer in the organic light emitting diode according to the present invention.

Specifically, the ITO glass having the insulating film pattern was placed in a vacuum chamber, a base pressure was set to $1\times10^{-7}$ torr, and DNTPD was deposited on ITO, thus forming a hole injection layer having a thickness of 400 Å or 840 Å, on which a-NPB was then deposited, thus forming a hole transport layer (HTL) in the thickness range as shown in FIGS. 7 to 9. Subsequently, $Alq_3$, as a host of the first region corresponding to the red emission material layer, and DCJTB (1 wt %), as a dopant, were co-deposited on the hole transport layer, giving an emission material layer 250 Å thick, $Alq_3$, as a host of the second region corresponding to the green emission material layer, and C545T (1 wt %), as a dopant, were co-deposited, yielding an emission material layer 250 Å thick, and β-AND, as a host of the third region corresponding to the blue emission material layer, and Compound 400 (3 wt %), as a dopant, were co-deposited, giving an emission material layer 250 Å thick, after which $Alq_3$ was deposited on the emission material layer, giving an electron transport layer 300 Å thick.

In the above configuration, when deposition is performed so that the HTL is 70 nm thick in the red emission material layer (Red) region, the HTL is 150 nm thick in the green emission material layer (Green) region, and the HTL is 110 nm thick in the blue emission material layer (Blue) region, it is preferably performed in a manner in which the HTL 70 nm thick is deposited on each of the red, green, and blue regions, the mask is replaced, the HTL 40 nm thick is deposited on the regions corresponding to green and blue, the mask is replaced again, and the HTL 40 nm thick is deposited at the position corresponding to the green region, thereby forming the HTLs having the corresponding thicknesses. As such, the EML is configured such that the red emission material layer is 40 nm thick, the green emission material layer and the blue emission material layer are each 20 nm thick, and each ETL is 30 nm thick.

Subsequently, a 5 Å thick LiF electron injection layer was formed, and an upper electrode 71 was then formed by depositing MgAg.

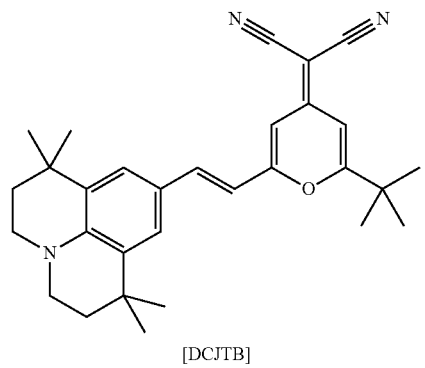

[DCJTB]

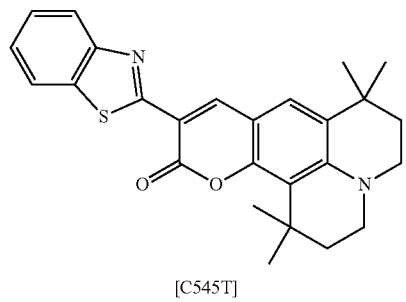

[C545T]

-continued

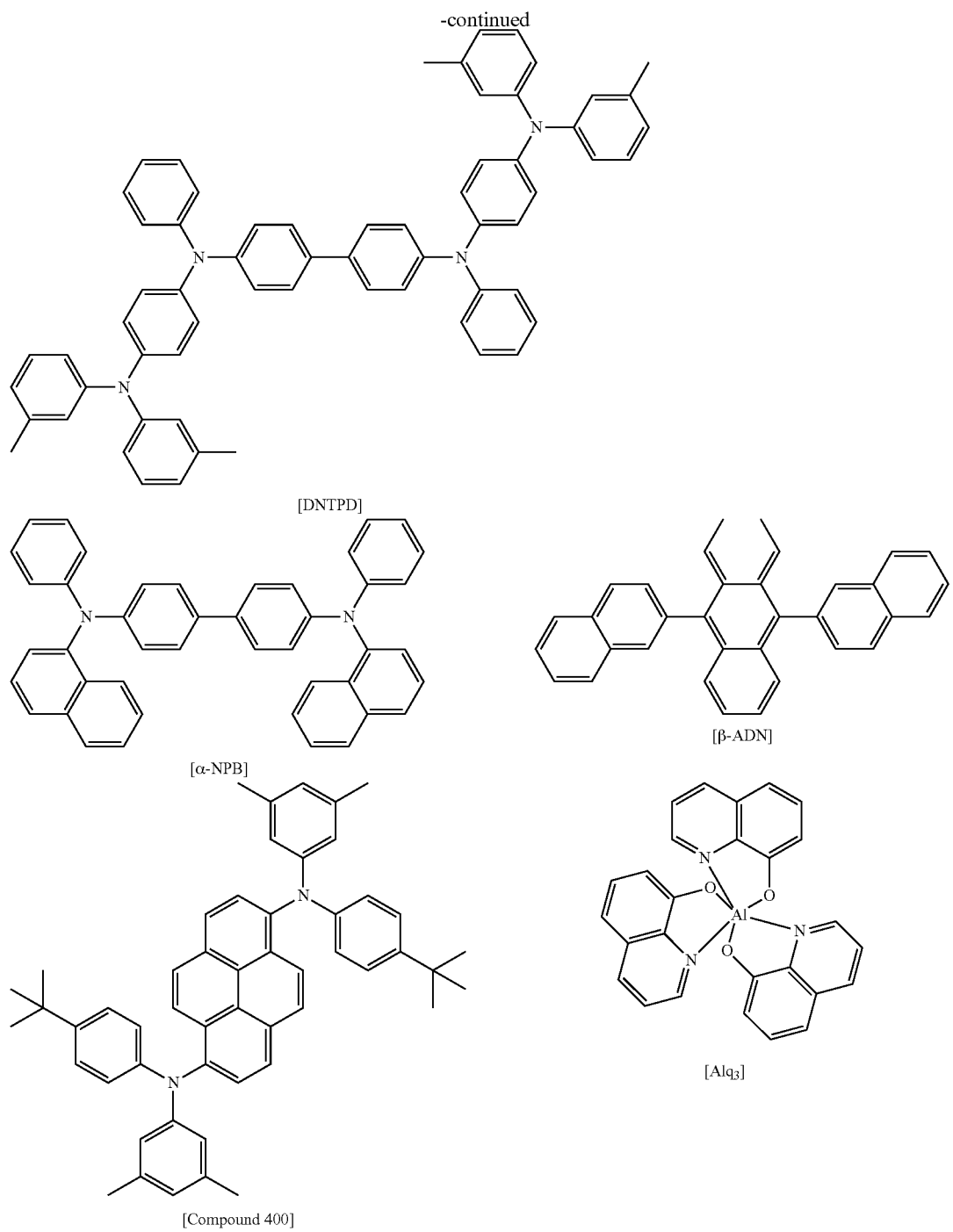

[DNTPD]

[α-NPB]

[β-ADN]

[Compound 400]

[Alq₃]

The upper electrode 71 was composed of Al (1 nm)/MgAg (13 nm) and thus possessed light-transmitting properties, and the formed electrode thickness was 140 Å.

5. A functional layer 80 was formed to a thickness of 110 nm using N,N'-diphenyl-N,N'-bis-[4-(phenyl-m-tolyl-amino)-phenyl]-biphenyl-4,4'-diamine (DNTPD) by vacuum thermal deposition only on the upper electrode corresponding to the region having the blue emission material layer, and a reflective layer 90 was formed to a thickness of 120 nm using Al by vacuum deposition on the functional layer and on the upper electrode corresponding to the region having the red emission material layer and the region having the green emission material layer, resulting in an organic light emitting diode according to the present invention.

Evaluation of Performance of Organic Light Emitting Diode

FIGS. 7 to 9 illustrate the EL spectrum depending on changes in the thickness of the hole transport layer for each region in the present invention.

More specifically, FIG. 7 illustrates the EL spectrum of the blue emission material layer when the thickness of the hole transport layer is changed in the range of 60 to 140 nm under the condition that the hole injection layer (40 nm)/hole transport layer/emission material layer (20 nm, blue)/electron transport layer (30 nm)/upper electrode (MgAg, 14 nm)/functional layer (110 nm)/reflective layer (120 nm) are formed.

FIG. 8 illustrates the EL spectrum of the green emission material layer when the thickness of the hole transport layer is changed in the range of 100 to 170 nm under the condition that the functional layer is not formed and the hole injection layer (70 nm)/hole transport layer/emission material layer (20 nm, green)/electron transport layer (30 nm)/upper electrode (MgAg, 14 nm)/reflective layer (120 nm) are formed.

FIG. 9 illustrates the EL spectrum of the red emission material layer when the thickness of the hole transport layer is changed in the range of 70 to 190 nm under the condition that the functional layer is not formed and the hole injection layer (90 nm)/hole transport layer/emission material layer (40 nm, red)/electron transport layer (30 nm)/upper electrode (MgAg, 14 nm)/reflective layer (120 nm) are formed.

As illustrated in FIG. 7, when the thickness of the hole transport layer (HTL) is 110 nm, a maximum resonance effect can be exhibited.

As illustrated in FIG. 8, when the thickness of the hole transport layer (HTL) is 160 nm, a maximum resonance effect can be exhibited. As illustrated in FIG. 9, when the thickness of the hole transport layer (HTL) is 190 nm, a maximum resonance effect can be exhibited.

The manufactured organic light emitting diode is configured such that the functional layer may be formed on a portion of the upper electrode, instead of being formed on the entire upper electrode. For example, the functional layer is not formed on the regions including the green and red emission material layers, and Al, useful as the reflective layer is deposited and may be subjected to ohmic contact with the cathode (MgAg or Al/MgAg) as the upper electrode, thus lowering the resistance of the cathode.

When the functional layer is formed on the entire upper electrode, the resistance of the upper electrode (MgAg) corresponds to the total resistance. On the other hand, when the functional layer is formed on a portion of the upper electrode, the upper electrode and the reflective layer are connected to each other, thus lowering the total resistance to thereby reduce the driving voltage of the diode. Preferably, when the functional layer is provided on the blue region, lower CIEy may result, thus increasing color reproducibility, decreasing the driving voltage, and raising power efficiency.

Thereby, in the fabrication of a large-area organic light emitting diode, a voltage drop can be prevented from occurring upon driving the diode, thus realizing an organic light emitting diode having uniform brightness, a long lifetime and stability.

INDUSTRIAL APPLICABILITY

According to the present invention, in the fabrication of an organic light emitting diode having high color quality, high luminance and a long lifetime, a voltage drop of the upper electrode can be decreased, thus reducing power consumption.

The invention claimed is:

1. An organic light emitting diode, comprising:
 a light-transmitting substrate including a first region and a second region separated from the first region;
 a first lower electrode formed on the first region of the light-transmitting substrate and a second lower electrode formed on the second region thereof;
 a first organic thin film layer including a first emission material layer, formed on the first lower electrode of the first region, and a second organic thin film layer including a second emission material layer, formed on the second lower electrode of the second region; and
 a light-transmitting upper electrode formed on the first organic thin film layer and the second organic thin film layer and configured such that portions corresponding to the first region and the second region are connected to each other,
 wherein a functional layer that enables mutual reinforcement and interference of transmitted light is formed on a portion of the upper electrode corresponding to any one of the first region and the second region, and
 a conductive reflective layer is formed on the functional layer and on a remaining portion of the upper electrode on which the functional layer is not formed, the conductive reflective layer being configured such that portions corresponding to the first region and the second region are connected to each other, whereby the upper electrode and the reflective layer are connected to each other through ohmic contact.

2. The organic light emitting diode of claim 1, further comprising an auxiliary electrode formed on an edge of the lower electrode.

3. The organic light emitting diode of claim 1, wherein each lower electrode is a conductive transparent electrode and has a thickness of 1 to 1000 nm.

4. The organic light emitting diode of claim 1, wherein the upper electrode has a transmittance of 10% or more and a resistance ranging from 0.1 mΩ to 500 Ω.

5. The organic light emitting diode of claim 1, wherein the upper electrode has a thickness of 1 to 1000 nm, and a material for the upper electrode comprises any one or a combination of two or more selected from among copper, chromium, molybdenum, nickel, aluminum, magnesium, silver, gold, platinum, indium tin oxide (ITO), indium zinc oxide (IZO), zinc oxide (ZnO), $ZnO/Ga_2O_3$, $ZnO/Al_2O_3$, sodium, a sodium-potassium alloy, cesium, magnesium, lithium, a magnesium-silver alloy, aluminum, aluminum oxide, an aluminum-lithium alloy, indium, a rare earth metal, and mixtures thereof with an organic light-emitting medium material.

6. The organic light emitting diode of claim 1, wherein the functional layer has a refractive index of 0.1 to 10 and a thickness of 1 to 1000 nm.

7. The organic light emitting diode of claim 1, wherein the functional layer comprises any one or a combination of two or more selected from among an inorganic material, including metal oxide or metal nitride; and an organic material, including a conductive organic material, a polymer compound, a mixture of a conductive organic material and a polymer compound, a hole injection material, a hole transport material, an electron transport material, a host material, and a dopant material.

8. The organic light emitting diode of claim 1, wherein mutual reinforcement and interference of light emitted from the organic light emitting diode are controlled by adjusting a thickness of the functional layer or the light-transmitting upper electrode.

9. The organic light emitting diode of claim 1, wherein the reflective layer has a reflectance of 20% or more.

10. The organic light emitting diode of claim 1, wherein the reflective layer comprises any one or a combination of two or more selected from among aluminum, magnesium, silver, gold, platinum, chromium, cobalt, tungsten, calcium, lithium, and sodium, and has a thickness of 1 to 5000 nm.

11. The organic light emitting diode of claim 1, wherein the organic thin film layer comprises at least one selected from among a hole injection layer, a hole transport layer, an electron blocking layer, a layer having both a hole injection function and a hole transport function, an emission material layer, a hole blocking layer, an electron transport layer, and an electron injection layer.

12. The organic light emitting diode of claim 11, wherein mutual reinforcement and interference of light are controlled by changing a thickness of at least one selected from among the hole injection layer, the hole transport layer, the electron blocking layer, the layer having both a hole injection function and a hole transport function, the emission material layer, the hole blocking layer, the electron transport layer, and the electron injection layer, which are included in the organic thin film layer.

13. The organic light emitting diode of claim 11, wherein the emission material layer comprises a combination of at least one host and at least one dopant.

14. The organic light emitting diode of claim 1, further comprising a capping layer disposed between the lower electrode and the substrate or on an outer surface of the substrate in order to prevent total reflection of light to thus increase luminous efficiency of an organic emission material.

15. The organic light emitting diode of claim 1, wherein the organic light emitting diode includes a blue emission material, a green emission material, or a red emission material, and each emission material is a fluorescent material or a phosphorescent material.

16. The organic light emitting diode of claim 1, wherein the organic light emitting diode is used for any one selected from among a flat panel display device, a flexible display device, a solid color or white flat panel illuminator, and a solid color or white flexible illuminator.

17. An organic light emitting diode, comprising:
a light-transmitting substrate including a first region, a second region separated from the first region, and a third region separated from the first region and the second region;
a first lower electrode formed on the first region of the light-transmitting substrate, a second lower electrode formed on the second region thereof, and a third lower electrode formed on the third region thereof;
a first organic thin film layer including a first emission material layer, formed on the first lower electrode of the first region, a second organic thin film layer including a second emission material layer, formed on the second lower electrode of the second region, and a third organic thin film layer including a third emission material layer, formed on the third lower electrode of the third region; and
a light-transmitting upper electrode formed on the first organic thin film layer, the second organic thin film layer, and the third organic thin film layer and configured such that portions corresponding to the first region, the second region and the third region are connected to each other,
wherein a functional layer that enables mutual reinforcement and interference of transmitted light is formed on a portion of the upper electrode corresponding to any one or two of the first region, the second region and the third region, and
a conductive reflective layer is formed on the functional layer and on a remaining portion of the upper electrode on which the functional layer is not formed, the conductive reflective layer being configured such that portions corresponding to the first region, the second region and the third region are connected to each other, whereby the upper electrode and the reflective layer are connected to each other through ohmic contact.

18. The organic light emitting diode of claim 17, wherein each of the first emission material layer, the second emission material layer and the third emission material layer is a red, green or blue emission material layer for emitting light in a wavelength range of 380 to 800 nm.

19. The organic light emitting diode of claim 18, wherein the functional layer is formed on the upper electrode corresponding to a region where the blue emission material layer is formed.

20. The organic light emitting diode of claim 17, wherein the functional layer is formed on a portion of the upper electrode corresponding to any one of the first region, the second region and the third region.

21. A method of manufacturing an organic light emitting diode, comprising:
providing a light-transmitting substrate including a first region and a second region separated from the first region, and forming a first lower electrode and a second lower electrode respectively on the first region and the second region of the light-transmitting substrate;
forming a first organic thin film layer including a first emission material layer on the first lower electrode of the first region and forming a second organic thin film layer including a second emission material layer on the second lower electrode of the second region;
forming, on the first organic thin film layer and the second organic thin film layer, a light-transmitting upper electrode configured such that portions corresponding to the first region and the second region are connected to each other;
forming, on a portion of the upper electrode corresponding to any one of the first region and the second region, a functional layer that enables mutual reinforcement and interference of transmitted light; and
forming a conductive reflective layer on the functional layer and on a remaining portion of the upper electrode on which the functional layer is not formed, wherein the conductive reflective layer is configured such that portions corresponding to the first region and the second region are connected to each other, whereby the upper electrode and the reflective layer are connected to each other through ohmic contact.

22. The method of claim 21, wherein the organic thin film layer comprises at least one selected from among a hole injection layer, a hole transport layer, an electron blocking layer, a functional layer having both a hole injection function and a hole transport function, an emission material layer, a hole blocking layer, an electron transport layer, and an electron injection layer.

23. The method of claim 22, wherein at least one selected from among the lower electrode, the hole injection layer, the hole transport layer, the electron blocking layer, the functional layer having both a hole injection function and a hole transport function, the emission material layer, the hole blocking layer, the electron transport layer, the electron injection layer, the light-transmitting upper electrode, the functional layer and the reflective layer is formed using a deposition process or a solution process.

24. A method of manufacturing an organic light emitting diode, comprising:
providing a light-transmitting substrate including a first region, a second region separated from the first region, and a third region separated from the first region and the second region, and forming a first lower electrode, a second lower electrode and a third lower electrode respectively on the first region, the second region and the third region of the light-transmitting substrate;

forming a first organic thin film layer including a first emission material layer on the first lower electrode of the first region, forming a second organic thin film layer including a second emission material layer on the second lower electrode of the second region, and forming a third organic thin film layer including a third emission material layer on the third lower electrode of the third region;

forming, on the first organic thin film layer, the second organic thin film layer and the third organic thin film layer, a light-transmitting upper electrode configured such that portions corresponding to the first region, the second region and the third region are connected to each other;

forming, on a portion of the upper electrode corresponding to any one or two of the first region, the second region and the third region, a functional layer that enables mutual reinforcement and interference of transmitted light; and forming a conductive reflective layer on the functional layer and on a remaining portion of the upper electrode on which the functional layer is not formed, wherein the conductive reflective layer is configured such that portions corresponding to the first region, the second region and the third region are connected to each other, whereby the upper electrode and the reflective layer are connected to each other through ohmic contact.

* * * * *